(12) United States Patent
Sun et al.

(10) Patent No.: US 10,132,868 B2
(45) Date of Patent: Nov. 20, 2018

(54) BATTERY MANAGEMENT SYSTEM AND METHOD THEREOF

(71) Applicant: Industrial Technology Research Institute, Hsin-Chu (TW)

(72) Inventors: Chein-Chung Sun, Kaohsiung (TW); Chun-Hung Chou, Tainan (TW); Chi-Hua Chen, Hsinchu County (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 29 days.

(21) Appl. No.: 15/632,665

(22) Filed: Jun. 26, 2017

(65) Prior Publication Data
US 2018/0172770 A1 Jun. 21, 2018

(30) Foreign Application Priority Data
Dec. 20, 2016 (TW) .............................. 105142304 A

(51) Int. Cl.
*H02J 7/00* (2006.01)
*G01R 31/36* (2006.01)
(Continued)

(52) U.S. Cl.
CPC ...... *G01R 31/3606* (2013.01); *B60L 11/1851* (2013.01); *G06F 1/3206* (2013.01);
(Continued)

(58) Field of Classification Search
CPC ... G01R 31/3606; G01R 31/36; G06F 1/3206; G06F 1/26; H01M 2/34; H01M 2/348;
(Continued)

(56) References Cited

U.S. PATENT DOCUMENTS

| 6,501,249 | B1 * | 12/2002 | Drori ................. G01R 31/3613 320/149 |
| 7,619,392 | B2 | 11/2009 | Wang et al. |

(Continued)

FOREIGN PATENT DOCUMENTS

| CN | 103066570 | 4/2013 |
| CN | 103490390 | 1/2014 |

(Continued)

OTHER PUBLICATIONS

Taiwan Intellectual Property Office, "Office Action" dated Dec. 4, 2017 Taiwan.
(Continued)

*Primary Examiner* — Nathaniel Pelton
(74) *Attorney, Agent, or Firm* — WPAT, PC

(57) ABSTRACT

A battery management system is provided, which may include a power supply module, a measurement module, a switch module and a processing module. The power supply module may be electrically coupled to a load or a charging power source via the switch module. The measurement module may measure a plurality of operation signals from the power supply module. The processing module may determine the operation status of the power supply module by cross comparison between the operation signals, and activate a safety protection item according to the operations signals and the operation status; the processing module may determine to activate a global protection process to turn off the switch module or activate a local protection process to turn off the switch module after a buffer time according to the danger level of the safety protection item.

32 Claims, 22 Drawing Sheets

(51) Int. Cl.
*G06F 1/32* (2006.01)
*B60L 11/18* (2006.01)
*H01M 2/34* (2006.01)
*H01M 10/48* (2006.01)
*G06F 1/26* (2006.01)
*H01M 10/42* (2006.01)

(52) U.S. Cl.
CPC .............. *H01M 2/34* (2013.01); *H01M 2/348* (2013.01); *H01M 10/425* (2013.01); *H01M 10/48* (2013.01); *H01M 10/486* (2013.01); *G01R 31/36* (2013.01); *G06F 1/26* (2013.01); *H01M 2010/4271* (2013.01); *H01M 2200/00* (2013.01); *H01M 2200/10* (2013.01); *H01M 2220/20* (2013.01)

(58) Field of Classification Search
CPC .. H01M 10/425; H01M 10/48; H01M 10/486; H01M 2010/4271; H01M 2200/00; H01M 2200/10; H01M 2200/20
USPC .......................................................... 320/152
See application file for complete search history.

(56) References Cited

U.S. PATENT DOCUMENTS

| | | | |
|---|---|---|---|
| 8,957,639 | B2 * | 2/2015 | Holsen ............... G01R 31/3658 320/134 |
| 2007/0145949 | A1 | 6/2007 | Matsushima et al. |
| 2008/0278115 | A1 | 11/2008 | Huggins |
| 2012/0212176 | A1 | 8/2012 | Park |
| 2012/0280661 | A1 * | 11/2012 | Nam ..................... H02J 7/0031 320/136 |
| 2013/0323554 | A1 | 12/2013 | Heubner et al. |

FOREIGN PATENT DOCUMENTS

| | | |
|---|---|---|
| CN | 103786583 | 5/2014 |
| CN | 204103553 | 1/2015 |
| CN | 105599632 | 5/2016 |
| TW | 201121189 | 6/2011 |
| TW | 201418065 A | 5/2014 |
| TW | 201427230 | 7/2014 |

OTHER PUBLICATIONS

Irsyad Nashirul Haq; et al., "Development of Battery Management System for Cell Monitoring and Protection", Nov. 24-25, 2014, p. 203-208, IEEE International Conference on Electrical Engineering and Computer Science.

Mark Dewey et al, "Battery Pack Circuit Design for Safety and Protection", PolySwitch Circuit Protection, Nov. 7-9, 1995, p. 543-551, Raychem Corporation.

Slavomir Kascak; et al., "Testing of Overcurrent Protection for the Battery Supplied System", 2016, p. 168-171, IEEE.

Waraporn Puviwatnangkurn; et al., "Overcurrent Protection Scheme of BMS for Li-Ion Battery used in Electric Bicycles", 2013, IEEE.

Roger Hedding; et al., "Protection of Battery Energy Storage Systems", Protective Relay, 2011, p. 155-159, IEEE.

* cited by examiner

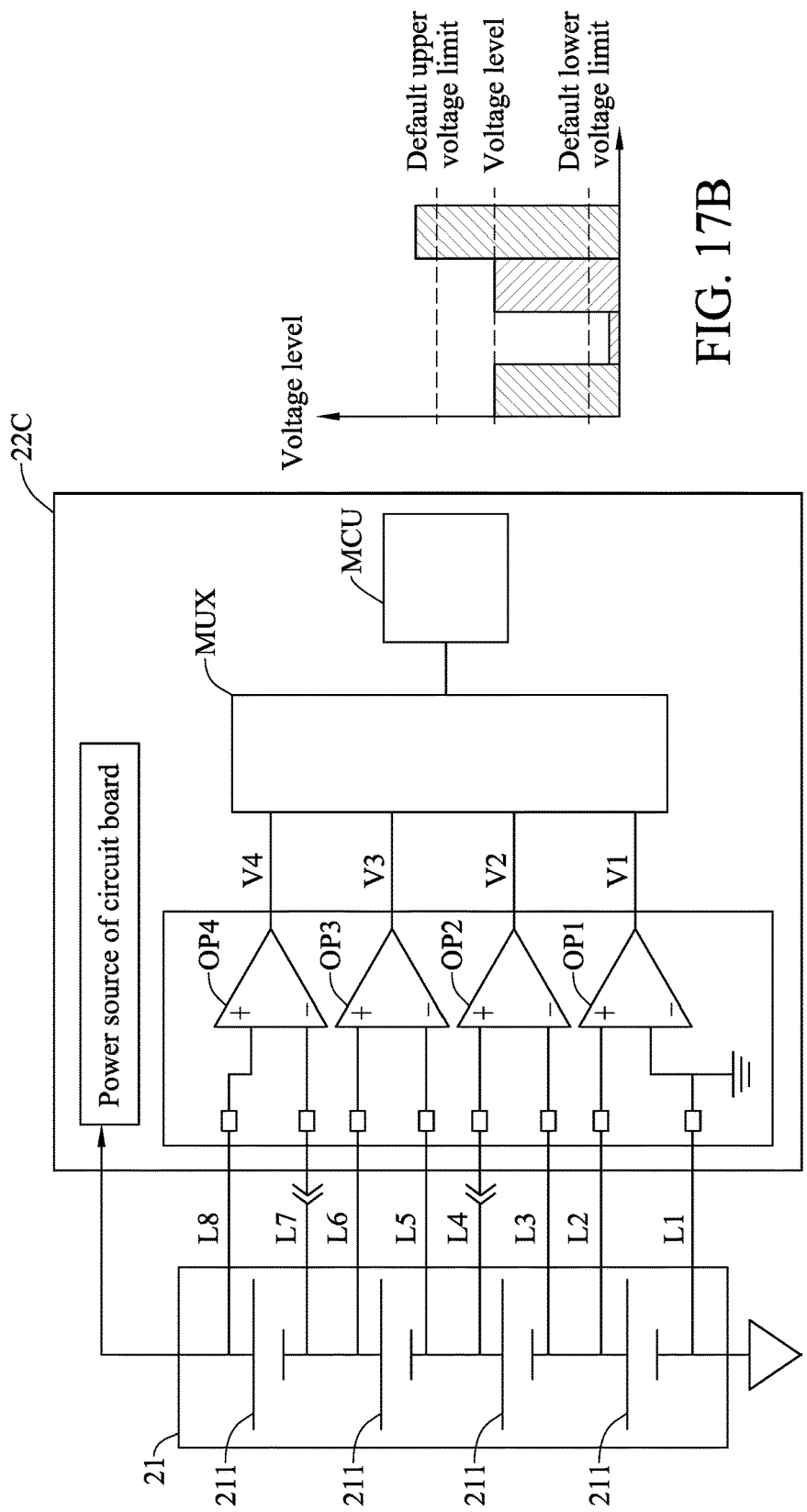

BATTERY MANAGEMENT SYSTEM AND METHOD THEREOF

CROSS REFERENCE TO RELATED APPLICATION

All related applications are incorporated by reference. The present application is based on, and claims priority from, Taiwan Application Serial Number 105142304, filed on Dec. 20, 2016, the disclosure of which is hereby incorporated by reference herein in its entirety.

TECHNICAL FIELD

The technical field relates to a battery management system, in particular to a battery management system with advanced protection functions. The technical field further relates to the battery management method of the battery management system.

BACKGROUND

The major greenhouse gas in the Earth is $CO_2$; currently, the increase of $CO_2$ emission results in global warming and climate change; the major reason of the increase of $CO_2$ emission is the exhaust gas of gasoline vehicles. For the purpose of solving the above problems, the development of electric vehicles of low noise, low pollution and energy-saving has become the trend in the future.

However, as an electric vehicle needs to be powered by batteries, so the electric vehicle needs a battery management system (BMS) to prevent the batteries from malfunctioning in order to make sure that the driver can safely drive electric vehicle.

In general, the safe protection items provided by currently available battery management system includes over-voltage charge protection function, over-current charge protection function, over-temperature discharge protection function, over-temperature charge protection function and charge time protection function, etc. When a battery management system activates over-voltage charge protection function, the battery management system activates a protection function (e.g. turning off the charge switch of the batteries) when the voltage of the batteries in the charge status exceeds a voltage threshold value, and then deactivates the protection function when the voltage of the batteries in the charge status is lower than the voltage threshold value.

When executing over-current charge protection function, the battery management system activates a protection function (e.g. turning off the charge switch of the batteries) when the current of the batteries in the charge status exceeds a current threshold value, and then deactivates the protection function when the current of the batteries in the charge status is lower than the current threshold value.

When executing over-temperature charge protection function, the battery management system activates a protection function (e.g. turning off the charge switch of the batteries) when the temperature of the batteries in the charge status exceeds a temperature threshold value, and then deactivates the protection function when the temperature of the batteries in the charge status is lower than the temperature threshold value.

When executing over-temperature discharge protection function, the battery management system activates a protection function (e.g. turning off the discharge switch of the batteries) when the temperature of the batteries in the discharge status exceeds a temperature threshold value, and then deactivates the protection function when the temperature of the batteries in the discharge status is lower than the temperature threshold value.

When executing charge time protection function, the battery management system turns off the charge switch of the batteries when any one of the series voltages of the batteries reaches a default value or the charger detects that the charge time exceeds a default charge time.

SUMMARY

A battery management system is provided, which may include a power supply module, a measurement module, a switch module and a processing module. The power supply module may be electrically coupled to a load or a charging power source via the switch module. The measurement module may measure a plurality of operation signals from the power supply module. The processing module may determine the operation status of the power supply module by cross comparison between the operation signals, and activates a safety protection item according to the operations signals and the operation status; the processing module may determine to activate a global protection process to turn off the switch module or activate a local protection process to turn off the switch module after a buffer time according to the danger level of the safety protection item.

A battery management method is provided, which may include the following steps: electrically coupling a power supply module to a load or a charging power source via a switch module; measuring a plurality of operation signals from the power supply module by a measurement module; and determining an operation status of the power supply module by cross comparison between the operation signals, and activating a safety protection item according to the operations signals and the operation status by a processing module so as to determine to activate a global protection process to turn off the switch module or activate a local protection process to turn off the switch module after a buffer time.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein:

FIG. 17A is a nineteenth schematic view of the second embodiment in accordance with the present disclosure.

FIG. 17B is a twentieth schematic view of the second embodiment in accordance with the present disclosure.

DETAILED DESCRIPTION

Figure 1:
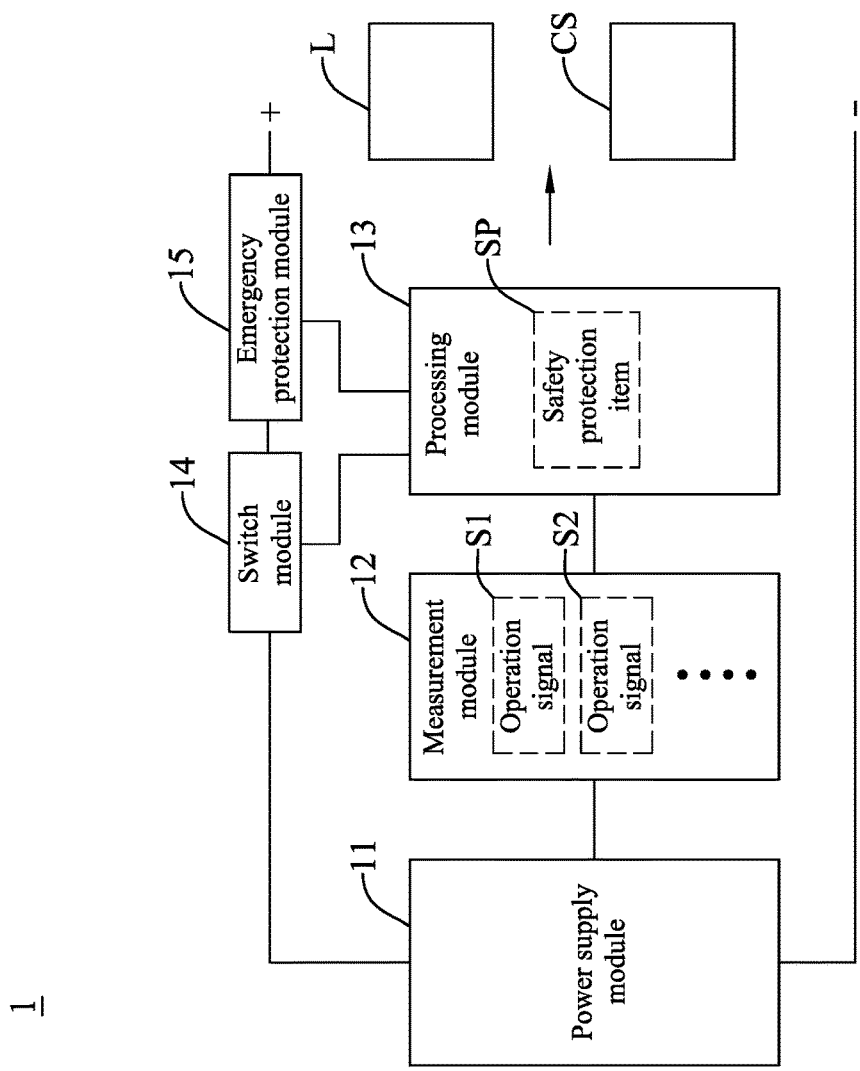
FIG. 1 is a block diagram of a battery management system of a first embodiment in accordance with the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

With reference to FIG. 1 for a block diagram of a battery management system of a first embodiment in accordance with the present disclosure, the battery management system 1 may include a power supply module 11, a measurement module 12, a switch module 14, an emergency protection module 15 and a processing module 13. In a preferred embodiment, the battery management system 1 may be applied to electrical vehicle or other different devices. The power supply module 11 may be electrically coupled to a load or a charging power source via the switch module 14 and the emergency protection module 15, and electrically coupled to the processing module 13; in a preferred embodiment, the power supply module 11 may be a battery pack.

The measurement module 12 may measure the power supply module 11 to obtain at least two operation signals; in a preferred embodiment, the operation signals may be more than 2, which may include two or more of current signal, voltage signal, temperature signal and state-of-charge (SOC) signal.

The processing module 13 may compare the operational signals S1~S2 with each other by cross comparison in order to determine the operation status of the power supply module 11, such as discharge status, charge status or at-rest status. The processing module 11 can precisely determine whether an abnormal measurement occurs or the power supply module 11 malfunctions in order to prevent from false operation.

If the processing module 13 determines that an abnormal measurement occurs, the processing module 13 can generate an abnormal measurement alarm signal according to at least one of the operation signals S1~S2 and an alarm threshold. On the other hand, if the processing module 13 detects that the abnormal measurement alarm signal generates and last a default time period, which means that the battery management system 1 can no longer correctly execute the measurement function; in the meanwhile, the processing module 13 can activate a local protection process.

If determining that the power supply module 1 malfunctions, the processing module 13 can activate a safety protection item SP according to the operation status of the power supply module 11 and the operation signals S1-S2. More specifically, the processing module 13 can activate the safety protection item SP according to the operation status of the power supply module 11, at least one of the operation signals S1-S2 and a protection activation threshold; in addition, the processing module 13 can deactivate the safety protection item SP according to the operation status of the power supply module 11, at least one of the operation signals S1-S2 and a protection deactivation threshold. The above mechanism can avoid that the safety protection item is frequently activated and deactivated. In a preferred embodiment, the safe protection item may be over-voltage charge protection function, under voltage discharge protection function, over-current charge protection function, over-current discharge protection function, over-temperature discharge protection function, over-temperature charge protection function, empty protection function, fully-charged protection function, constant-voltage charge stage protection function, internal short-circuited protection function or measurement line disconnection protection function.

More specifically, the processing module 13 may determine whether to activate the global protection process or the local protection process according to the danger level of the safety protection item SP. When the safety protection item SP activated by the processing module 13 has higher danger level, the processing module 13 may directly activate the global protection process to directly turn off the switch module 14 in order to stop the power supply module 11 powering the load L or being charged by the charging power source CS. On the contrary, When the safety protection item SP activated by the processing module 13 has lower danger level, the processing module 13 may activate the local protection process to turn off the switch module 14 after a buffer time in order to stop the power supply module 11 powering the load L or being charged by the charging power source CS; in other words, the processing module 13 may activate the global protection process after the buffer time, which allows the user to take some emergency measures; for example, the user can park the electric vehicle at a proper place so as to avoid that the electric vehicle suddenly loses all electricity when the user is driving the electric vehicle.

The emergency protection module 15 may be disposed in the charge path, discharge path or charge & discharge path, and the power supply module 11 may be electrically coupled to the load L or the charging power source CS via the emergency protection module 15 via the switch module 14, and electrically coupled to the processing module 13 so as to protect the battery management system 1. In a preferred embodiment, the emergency protection module 15 may be a passive fuse or an active fuse; the passive fuse can activate a self-cutoff function to be automatically cut off after the current exceeds the default threshold for several consecutive times; the active fuse can be cut off by the processing module 13 after the switch module 14 fails.

The embodiment is just for illustration only and not limitative of the present disclosure; the structure of the battery management system 1 and the functions of all elements thereof described above can be changed according to actual requirements.

By means of the above mechanism, the battery management system 1 can precisely determine whether an abnormal measurement occurs or the power supply module 11 malfunctions in order to avoid that the safety protection item SP is incorrectly activated due to noise interference, which can significantly improve the performance of the battery management system 1. In addition, when the safety protection item SP activated by the processing module 13 has lower danger level, the processing module 13 may activate the local protection process to provide a buffer time for the user to park the electric vehicle at a proper place so as to avoid that the electric vehicle suddenly loses all electricity when the user is driving the electric vehicle, which can better the safety of the battery management system 1. Further, the battery management system 1 can effectively prevent the safety protection item SP from being frequently activated and deactivated, which can achieve higher reliability.

It is worthy to point out that although the conventional battery management system can provide multiple safety protection items, the conventional battery management system considers only one signal when executing one safety protection item; thus, the false operation rate of the conventional battery management system tends to be increased because being interfered by noise. On the contrary, according to one embodiment of the present disclosure, the battery management system can determine the operation status of the power supply module by cross comparison between the operation signals of the power supply module, and activate a safety protection item according to the operations signals and the operation status, so the battery management system will not be interfered by noise. Accordingly, the false operation rate thereof can be reduced, which can significantly increase the performance of the battery management system.

Besides, the conventional battery management system tends to activate the protection function without alarm, so the electric vehicle may suddenly lose all electricity when the driver is driving the electric vehicle, which may result in serious danger. On the contrary, according to one embodiment of the present disclosure, the battery management system can activate the local protection process for the safety protection items without immediate danger, which can provide a buffer time for the user to park the electric vehicle at a proper place. Thus, the electric vehicle will not suddenly lose all electricity when the user is driving the electric vehicle; accordingly, the safety of the battery management system can be enhanced.

Moreover, when executing one safety protection item, the conventional battery management system tends to frequently activate and deactivate the protection function because the threshold for activating the protection function is the same with that for deactivating the protection function. On the contrary, according to one embodiment of the present disclosure, the battery management system can provide a protection activation threshold and a protection deactivation threshold for some safety protection items, which can avoid that these safety protection items are frequently activated and deactivated in order to further improve the reliability of the battery management system.

Figure 2:
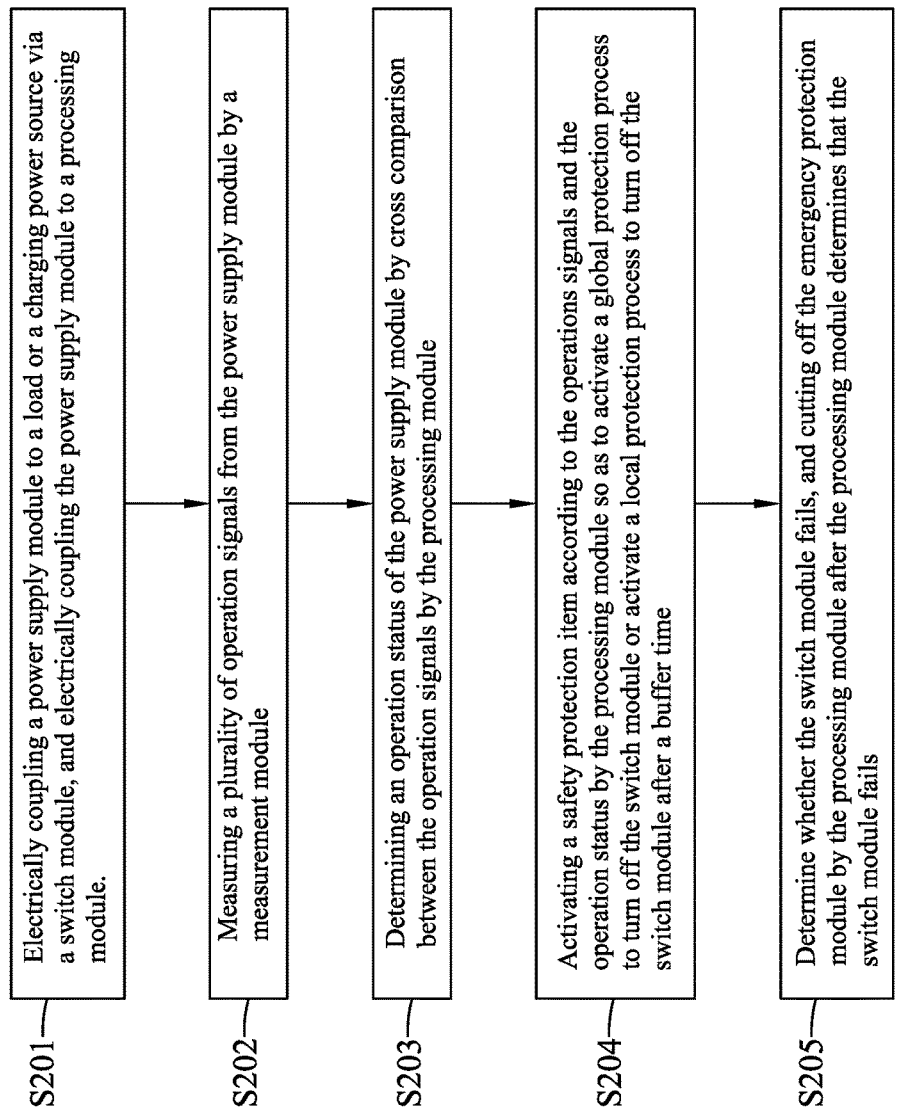
FIG. 2 is a flow chart of the first embodiment in accordance with the present disclosure.

With reference to FIG. 2 for a flow chart of the first embodiment in accordance with the present disclosure, the battery management method of the embodiment may include the following steps:

In Step S201: Electrically coupling a power supply module to a load or a charging power source via a switch module, and electrically coupling the power supply module to a processing module.

In Step S202: Measuring a plurality of operation signals from the power supply module by a measurement module.

In Step S203: Determining an operation status of the power supply module by cross comparison between the operation signals by the processing module.

In Step S204: Activating a safety protection item according to the operations signals and the operation status by the processing module so as to activate a global protection process to turn off the switch module or activate a local protection process to turn off the switch module after a buffer time.

In Step S205: Determine whether the switch module fails, and cutting off the emergency protection module by the processing module after the processing module determines that the switch module fails.

Figure 3:
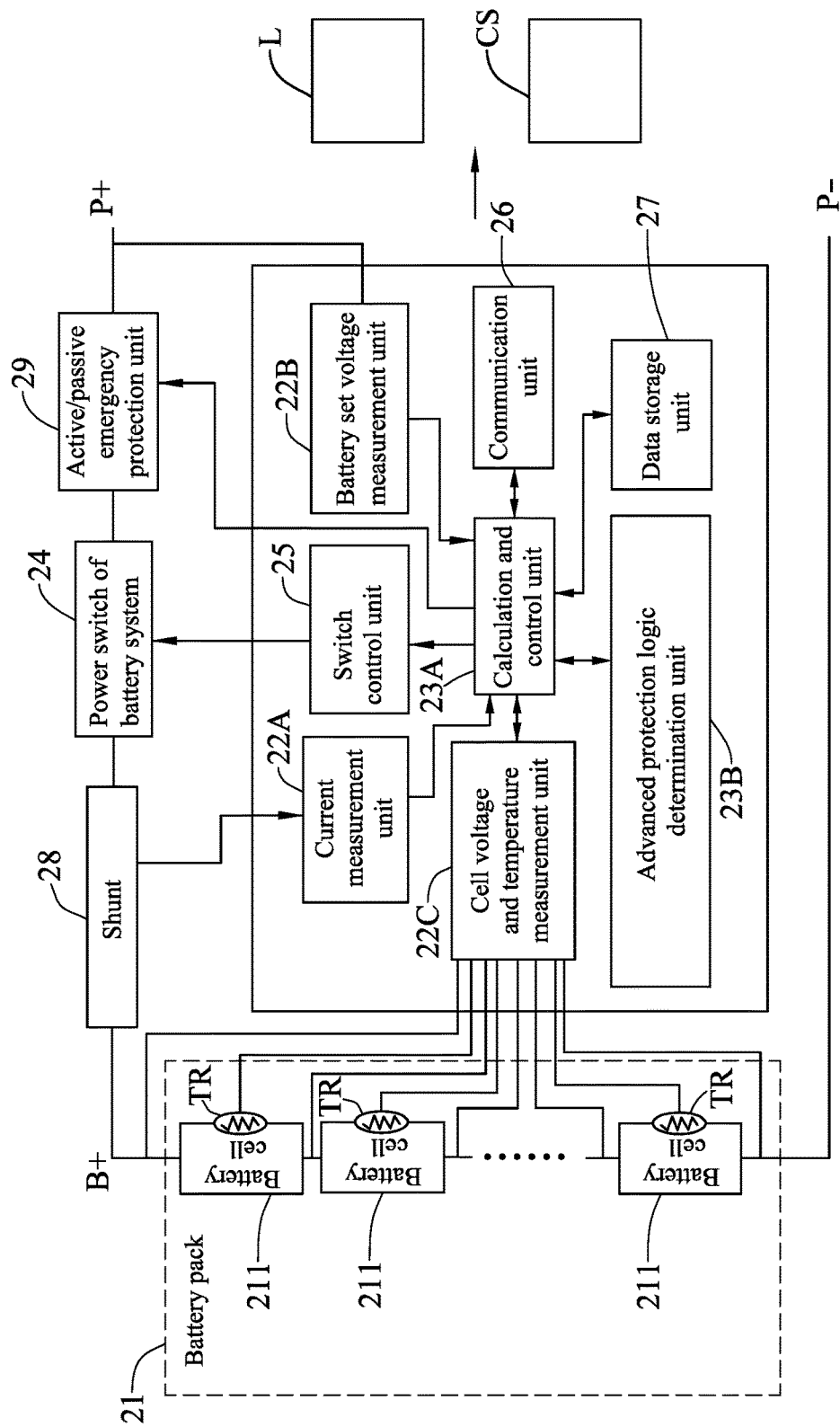
FIG. 3 is a block diagram of a battery management system of a second embodiment in accordance with the present disclosure.

With reference to FIG. 3 for a block diagram of a battery management system of a second embodiment in accordance with the present disclosure, the battery management system 2 may include a battery pack 21, a measurement module 22, a switch module 24, a processing module, a switch control module 25, a communication module 26, a data storage module 27, a shunt 28 and an active/passive emergency protection unit 29. In a preferred embodiment, the battery management system 2 may be applied to electrical vehicle or other different devices.

The battery pack 21 may include a plurality of battery units 211, and may be electrically coupled to the load L or the charging power source SC via the shunt 28, the switch module 24 and the active/passive emergency protection unit 29. The active/passive emergency protection unit 29 can activate a self-cutoff function to be automatically cut off after the current exceeds the default threshold for several consecutive times, or cut off by the processing module after the switch module 14 fails.

The measurement module 22 may include a current measurement unit 22A, a voltage measurement unit 22B and a cell voltage and temperature measurement unit 22C. The current measurement unit 22A can measure the current signals of the shunt 28 and determine whether the battery pack 21 is being charged or discharging. The voltage measurement unit 22B can measure the total output voltage of the battery pack 21 in order to determine the output level of the battery pack 21 and whether the battery pack 21 supplies power. The cell voltage and temperature measurement unit 22C can measure the voltage of each of the battery units 211, and be electrically coupled to each of the battery units 211 via a thermistor TR so as to measure the temperature thereof. By means of the above mechanism, the measurement module 22 can measure the battery pack 21 to acquire a plurality of operation signals, which may include two or more of current signal, voltage signal, temperature signal and stateof-charge signal, etc., and then transmit these operation signals to a calculation and control unit 23A.

The data storage module 27 may store a voltage measurement calibration table, a current measurement calibration table and a temperature measurement calibration table; in addition, the data storage module 27 may further store alarm signal setting parameters and setting parameters of all safety protection items, such that the battery management system 2 can be applied to different zones with different climates (such as tropical zone, temperate zone and frigid zone).

The switch control module 25 can turn on or turn off the switch module 24 to control the battery pack 21 to be electrically coupled to the load L or the charging power source SC; in a preferred embodiment, the switch control module 25 may be a microcontroller unit (MCU) and the like.

The processing module may include a calculation and control unit 23A and an advanced protection logic determination unit 23B, which may be a microcontroller unit (MCU) or other analog or digital electronic components. The calculation and control unit 23A can compare the operation signals with one another by cross comparison in order to determine the operation status of the battery pack 21, such as charge status, discharge status or at-rest status, and can calculate the charge capacity and discharge capacity; then, the calculation and control unit 23A can transmit the operation signals and other relevant information to the advanced protection logic determination unit 23B and the communication module 26. The advanced protection logic determination unit 23B can determine whether an abnormal measurement occurs or the battery pack 21 malfunctions according to the operation signals and the operation status of the battery pack 21. The calculation and control unit 23A can execute corresponding operations according to the logic determination result of the advanced protection logic determination unit 23B, the alarm signal setting parameters stored by the data storage module 27 and the setting parameters of all safety protection items so as to reduce the false operation rate.

If determining that the abnormal measurement occurs, the advanced protection logic determination unit 23B can generate an abnormal measurement alarm signal according to at least one of the operation signals and an alarm threshold. If the advanced protection logic determination unit 23B detects that the abnormal measurement signal is generated and last a default time period, it means that the battery management system 2 can no longer correctly execute the measurement function; in the meanwhile, the calculation and control unit 23A can activate a local protection process.

If the advanced protection logic determination unit 23B determines that the battery pack 21 malfunctions, the calculation and control unit 23A can activate a safety protection item according to the operation status of the battery pack 21 and the operation signals. More specifically, the calculation and control unit 23A can activate the safety protection item according to the operation status of the battery pack 21, at least one of the operation signals and a protection activation threshold. Besides, the calculation and control unit 23A can deactivate the safety protection item according to the operation status of the battery pack 21, at least one of the operation signals and a protection deactivation threshold. By means of the above mechanism, the battery management system 2 can effectively avoid that these safety protection item are frequently activated and deactivated. In the embodiment, the safety process item may be over-voltage charge protection function, under voltage discharge protection function, over-current charge protection function, over-current discharge protection function, over-temperature discharge protection function, over-temperature charge protection function, empty protection function, fully-charged protection function, constant-voltage charge stage protection function, internal short-circuited protection function or measurement line disconnection protection function. The following content of the embodiment will illustrate how the battery management system 2 activates the above safety protection items.

On the other hand, the calculation and control unit 23A can determine whether to activate the global protection process or the local protection process according to the danger level of the safety protection item. When the safety protection item activated by the calculation and control unit 23A has higher danger level, the calculation and control unit 23A may directly activate the global protection process to control the switch control module 25 to directly turn off the switch module 24 in order to stop the battery pack 21 powering the load L or being charged by the charging power source CS. On the contrary, When the safety protection item activated by the calculation and control unit 23A has lower danger level, the calculation and control unit 23A may activate the local protection process control the switch control module 25 to turn off the switch module 24 or cut off the active fuse 29 after a buffer time in order to stop the battery unit 21 powering the load L or being charged by the charging power source CS; in other words, the calculation and control unit 23A may activate the global protection process after the buffer time, which allows the user to take some emergency measures; for example, the user can park the electric vehicle at a proper place so as to avoid that the electric vehicle suddenly loses all electricity when the user is driving the electric vehicle.

The communication module 26 can transmit the information related to the battery pack 21 to an external device, such as voltage, temperature, current, integration results of charged amount and discharged amount, state of charge, deterioration status and protection status, etc. In this way, the external device can adjust and manage the power consumption of the battery pack 21 according to the above information.

Figure 4:
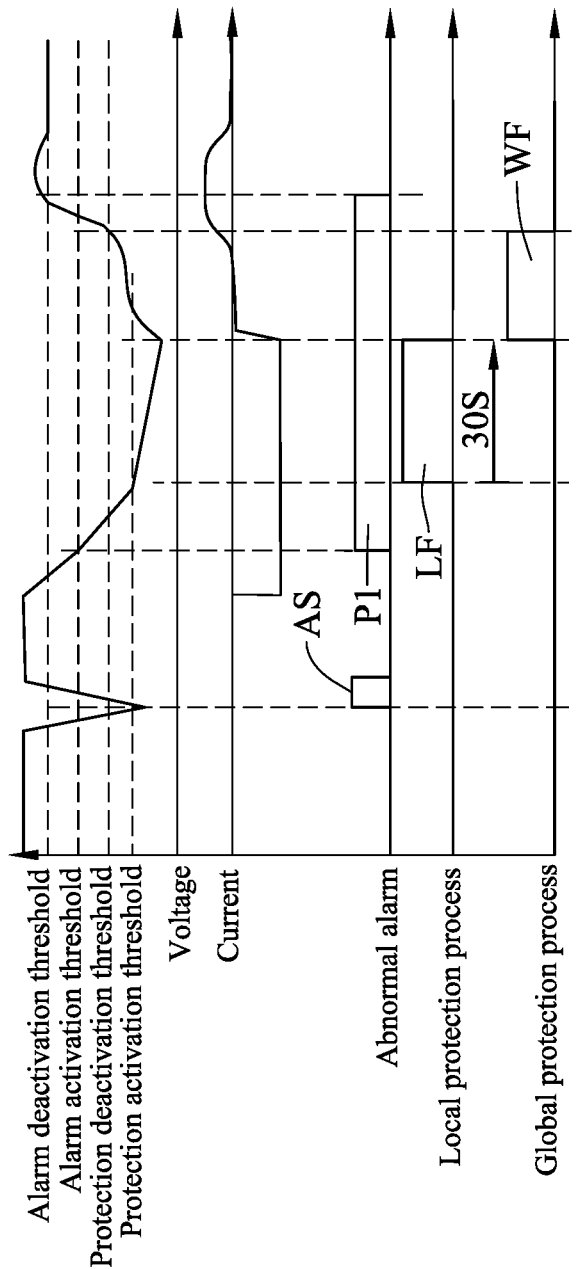
FIG. 4 is a first schematic view of the second embodiment in accordance with the present disclosure.

With reference to FIG. 4 for a first schematic view of the second embodiment in accordance with the present disclosure, FIG. 4 illustrates the process that the battery management system 2 activates the under voltage discharge protection function.

As shown in FIG. 4, when detecting that the voltage suddenly decreases but the current and the temperature remain unchanged, the processing module can determine that an abnormal measurement occurs because the voltage signal is interfered by noise. Thus, the processing module can activate an abnormal measurement alarm signal AS when the voltage decreases to an alarm activation threshold, and deactivate the abnormal measurement alarm signal AS when the voltage increases to an alarm deactivation threshold.

When detecting that the voltage suddenly decreases and the discharge current simultaneously increases, the processing module can determine that the battery pack 21 is in the discharge status. If the voltage continues to decrease to the alarm activation threshold, the processing module can activate an under voltage discharge protection alarm signal P1. When detecting that the voltage increases to the alarm deactivation threshold, the processing module can deactivate the under voltage discharge protection alarm signal P1. When detecting that the voltage continues to decrease to a protection activation threshold, the processing module can determine the condition is of low danger and should activate the under voltage discharge protection function to deal with the condition. Next, the processing module can activate the local protection process LF. When activating the local protection process LF, the processing module can deactivate the local protection process LF to activate the global protection process WF after the buffer time, such 30 seconds in order to control the switch control module 25 to turn off the switch module 24 to disconnect the battery pack 21 from the load L. When detecting that the voltage increases to a protection deactivation threshold, the processing module can deactivate the local protection process LF. On the contrary, the conventional battery management system will directly activate the under-voltage discharge protection function when detecting an abnormal voltage change, which cannot prevent from noise interference, so the under-voltage discharge protection function tends to be frequently activated. The under-voltage discharge protection function according to the present disclosure can effectively solve the above problem.

Figure 5:
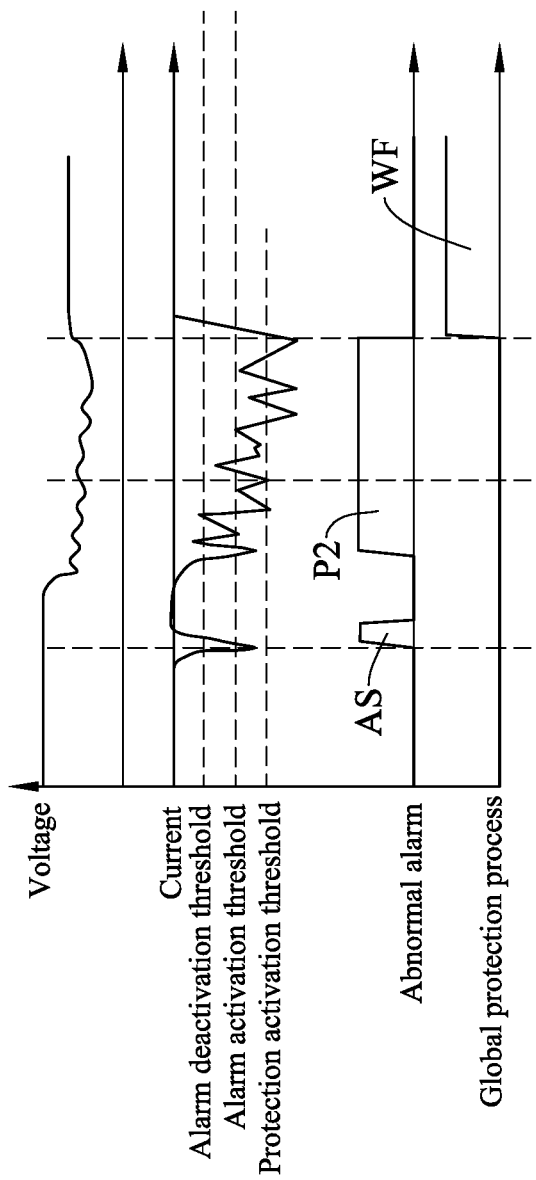
FIG. 5 is a second schematic view of the second embodiment in accordance with the present disclosure.

With reference to FIG. 5 for a second schematic view of the second embodiment in accordance with the present disclosure, FIG. 5 illustrates the process that the battery management system 2 activates the over-current discharge protection function.

As shown in FIG. 5, when detecting that the discharge current suddenly increases but the voltage remain unchanged, the processing module can determine that an abnormal measurement occurs because the current signal is interfered by noise. Thus, the processing module can activate an abnormal measurement alarm signal AS when the discharge current increases to an alarm activation threshold, and deactivate the abnormal measurement alarm signal AS when the voltage decreases to an alarm deactivation threshold.

When detecting that the discharge current suddenly increases to the alarm activation threshold and the voltage simultaneously decreases, the processing module can determine that the battery pack 21 is in the discharge status; meanwhile, the processing module can activate an over current discharge protection alarm signal P2. When detecting that the discharge current decreases to the alarm deactivation threshold, the processing module can deactivate the over current discharge protection alarm signal P2. When detecting that the discharge current continues to increase to a protection activation threshold and obtaining the same detection result for a default number of times (e.g. 3-5 times), the processing module can determine the condition is of high danger and should activate the over-current discharge protection function to deal with the condition. Next, the processing module can directly activate the global protection process WF. When activating the global protection process WF, the processing module can control the switch control module 25 to turn off the switch module 24 to disconnect the battery pack 21 from the load L. On the contrary, the conventional battery management system will directly activate the over-current discharge protection function when detecting an abnormal current change, which cannot prevent from noise interference, so the over-current discharge protection function tends to be frequently activated. The over-current discharge protection function according to the present disclosure can effectively solve the above problem.

Figure 6:
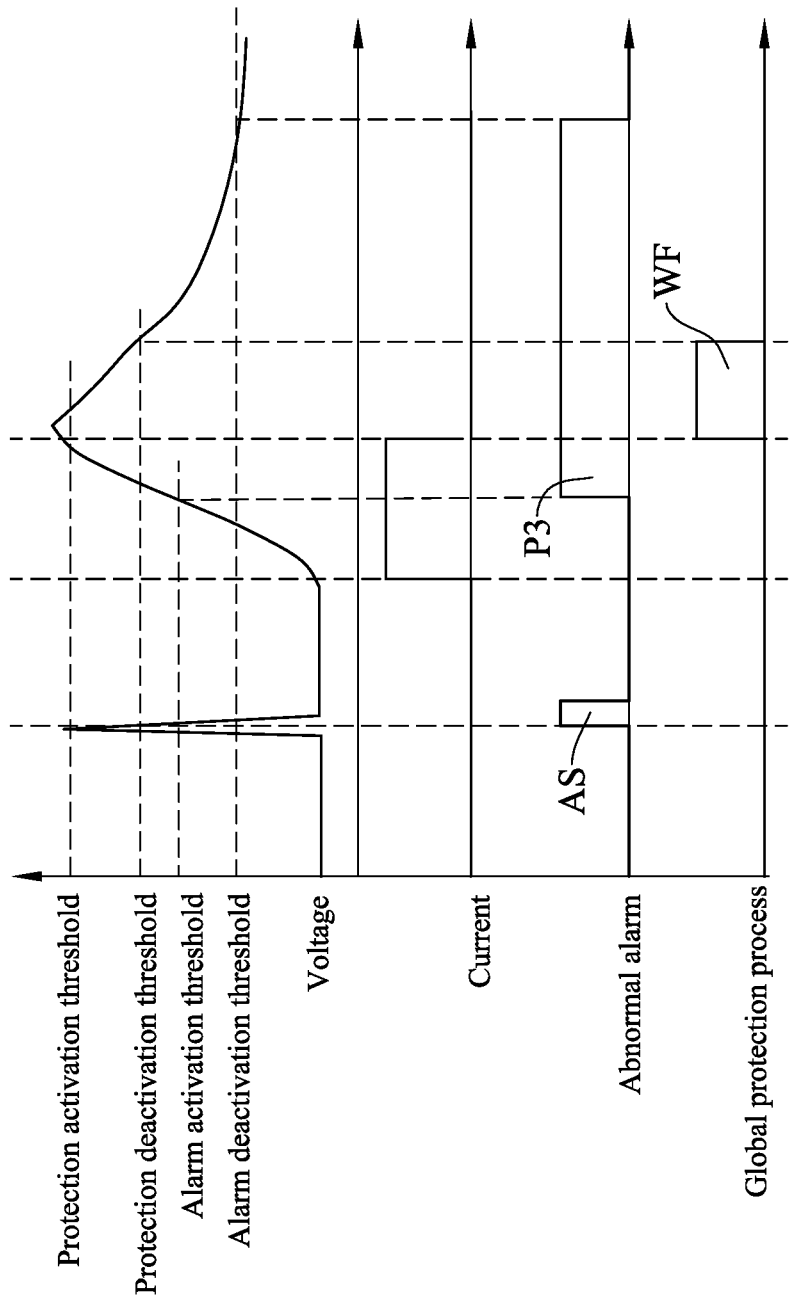
FIG. 6 is a third schematic view of the second embodiment in accordance with the present disclosure.

With reference to FIG. 6 for a third schematic view of the second embodiment in accordance with the present disclosure, FIG. 6 illustrates the process that the battery management system 2 activates the over-voltage charge protection function.

As shown in FIG. 6, when detecting that the voltage suddenly increases but the voltage and the temperature remain unchanged, the processing module can determine that an abnormal measurement occurs because the voltage signal is interfered by noise. Thus, the processing module can activate an abnormal measurement alarm signal AS when the voltage increases to an alarm activation threshold, and deactivate the abnormal measurement alarm signal AS when the voltage decreases to an alarm deactivation threshold.

When detecting that the voltage suddenly increases to the alarm activation threshold and the current simultaneously increases, the processing module can determine that the battery pack 21 is in the charge status; meanwhile, the processing module can activate an over voltage charge protection alarm signal P3. When detecting that the voltage decreases to the alarm deactivation threshold, the processing module can deactivate the over voltage charge protection alarm signal P3. When detecting that the voltage continues to increase to the protection activation threshold, the processing module can determine the condition is of high danger and should activate the over-voltage charge protection function to deal with the condition. Next, the processing module can directly activate the global protection process WF. When activating the global protection process WF, the processing module can control the switch control module 25 to turn off the switch module 24 to disconnect the battery pack 21 from the charging power source CS. When detecting the voltage decreases to a protection deactivation threshold, the processing module can deactivate the global protection process WF. On the contrary, the conventional battery management system will directly activate the over-voltage charge protection function when detecting an abnormal voltage change, which cannot prevent from noise interference, so the over-voltage charge protection function tends to be frequently activated. The over-voltage charge protection function according to the present disclosure can effectively solve the above problem.

Figure 7:
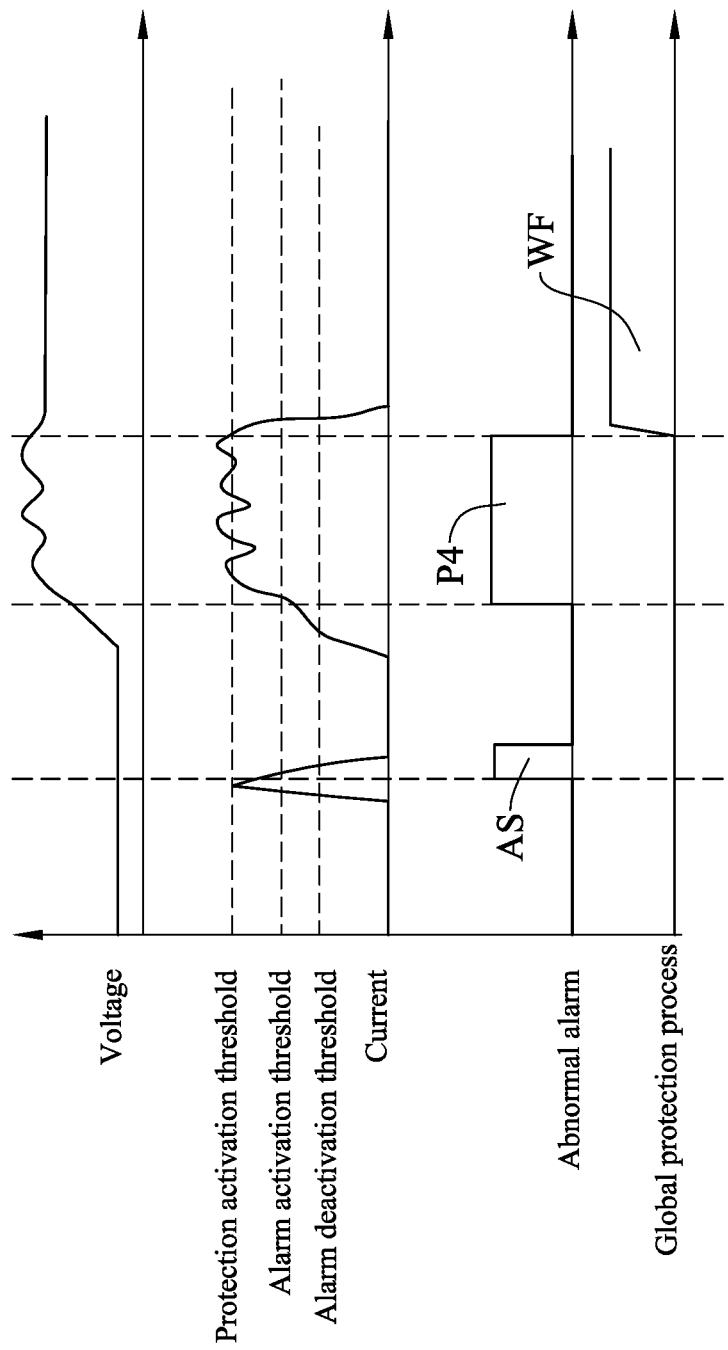
FIG. 7 is a fourth schematic view of the second embodiment in accordance with the present disclosure.

With reference to FIG. 7 for a fourth schematic view of the second embodiment in accordance with the present disclosure, FIG. 7 illustrates the process that the battery management system 2 activates the over-current charge protection function.

As shown in FIG. 7, when detecting that the current suddenly decreases but the voltage remain unchanged, the processing module can determine that an abnormal measurement occurs because the current signal is interfered by noise. Thus, the processing module can activate an abnormal measurement alarm signal AS when the current increases to an alarm activation threshold, and deactivate the abnormal measurement alarm signal AS when the current decreases to an alarm deactivation threshold.

When detecting that the current suddenly increases to the alarm activation threshold and the voltage simultaneously increases, the processing module can determine that the battery pack 21 is in the charge status; meanwhile, the processing module can activate an over current charge protection alarm signal P4. When detecting that the current decreases to the alarm deactivation threshold, the processing module can deactivate the over current charge protection alarm signal P4. When detecting that the current continues to increase to a protection activation threshold and obtaining the same detection result for a default number of times (e.g. 3-5 times), the processing module can determine the condition is of high danger and should activate the over-current charge protection function to deal with the condition. Next, the processing module can directly activate the global protection process WF. When activating the global protection process WF, the processing module can control the switch control module 25 to turn off the switch module 24 to disconnect the battery pack 21 from the charging power source CS. On the contrary, the conventional battery management system will directly activate the over-current charge protection function when detecting an abnormal current change, which cannot prevent from noise interference, so the over-current charge protection function tends to be frequently activated. The over-current charge protection function according to the present disclosure can effectively solve the above problem.

Figure 8:
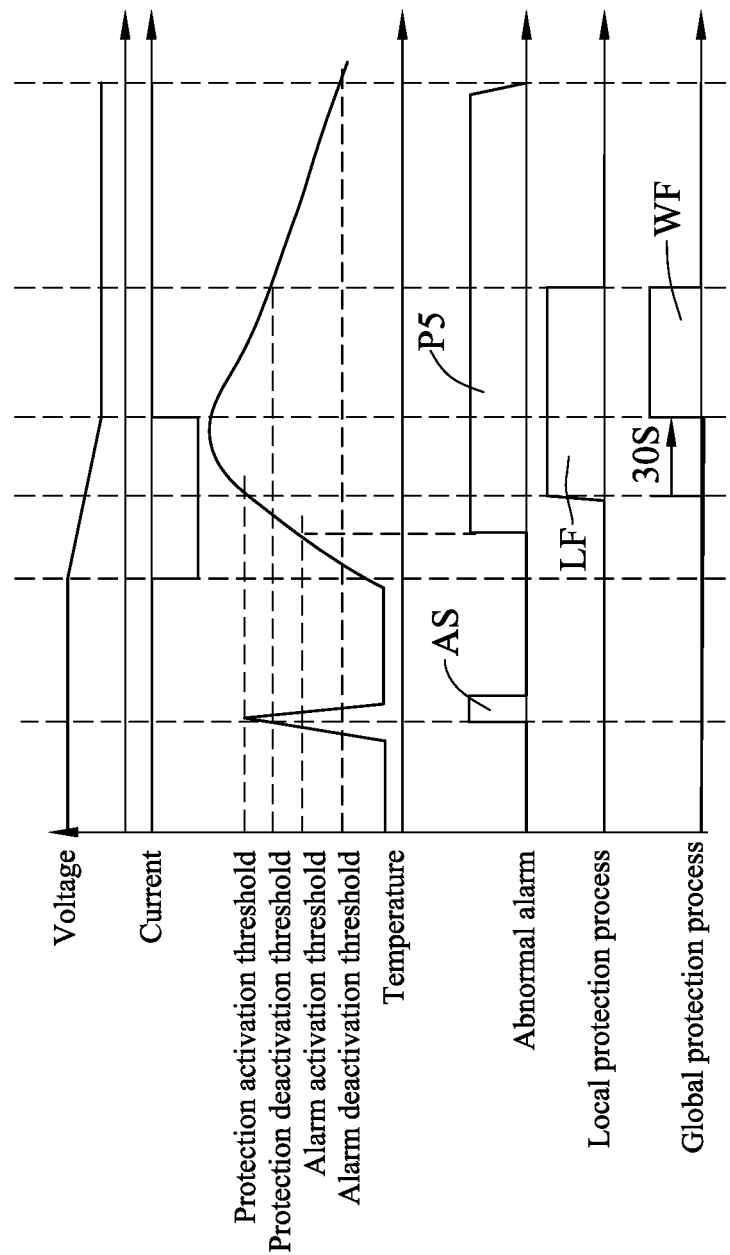
FIG. 8 is a fifth schematic view of the second embodiment in accordance with the present disclosure.

With reference to FIG. 8 for a fifth schematic view of the second embodiment in accordance with the present disclosure, FIG. 8 illustrates the process that the battery management system 2 activates the over-temperature discharge protection function.

As shown in FIG. 8, when detecting that the temperature suddenly increases but the voltage and the current remain unchanged, the processing module can determine that an abnormal measurement occurs because the temperature signal is interfered by noise. Thus, the processing module can activate an abnormal measurement alarm signal AS when the temperature increases to an alarm activation threshold, and deactivate the abnormal measurement alarm signal AS when the temperature decreases to an alarm deactivation threshold.

When detecting that the current suddenly increases and the voltage simultaneously decreases, the processing module can determine that the battery pack 21 is in the discharge status. If the temperature increases to the alarm activation threshold, the processing module can activate an over-temperature discharge protection alarm signal P5. When detecting that the temperature decreases to the alarm deactivation threshold, the processing module can deactivate the over temperature discharge protection alarm signal P5. When detecting that the temperature continues to increase to a protection activation threshold, the processing module can determine the condition is of low danger and should activate the over-temperature discharge protection function to deal with the condition. Next, the processing module can activate the local protection process LF. When activating the local protection process LF, the processing module can deactivate the local protection process LF to activate the global protection process WF after the buffer time, such 30 seconds in order to control the switch control module 25 to turn off the switch module 24 to disconnect the battery pack 21 from the load L. When detecting that the temperature decreases to a protection deactivation threshold, the processing module can deactivate the local protection process LF. On the contrary, the conventional battery management system will directly activate the over-temperature discharge protection function when detecting an abnormal temperature change, which cannot prevent from noise interference, so the over-temperature discharge protection function tends to be frequently activated. The over-temperature discharge protection function according to the present disclosure can effectively solve the above problem.

Figure 9:
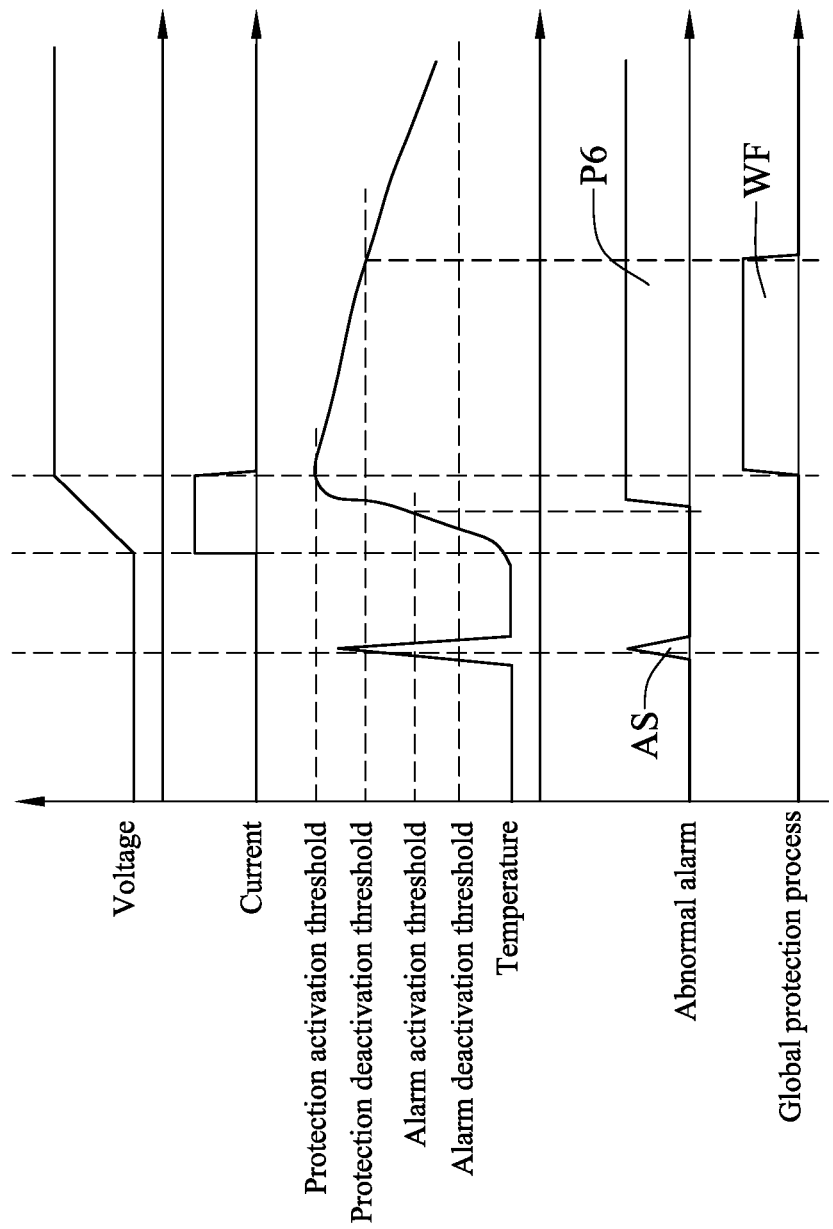
FIG. 9 is a sixth schematic view of the second embodiment in accordance with the present disclosure.

With reference to FIG. 9 for a sixth schematic view of the second embodiment in accordance with the present disclosure, FIG. 9 illustrates the process that the battery management system 2 activates the over-temperature charge protection function.

As shown in FIG. 9, when detecting that the temperature suddenly increases but the voltage and the current remain unchanged, the processing module can determine that an abnormal measurement occurs because the temperature signal is interfered by noise. Thus, the processing module can activate an abnormal measurement alarm signal AS when the temperature increases to an alarm activation threshold, and deactivate the abnormal measurement alarm signal AS when the temperature decreases to an alarm deactivation threshold.

When detecting that the temperature suddenly increases to the alarm activation threshold and the voltage simultaneously increases, the processing module can determine that the battery pack 21 is in the charge status; meanwhile, the processing module can activate an over temperature charge protection alarm signal P6. When detecting that the temperature decreases to the alarm deactivation threshold, the processing module can deactivate the over temperature charge protection alarm signal P6. When detecting that the temperature continues to increase to a protection activation threshold, the processing module can determine the condition is of high danger and should activate the over-temperature charge protection function to deal with the condition. Next, the processing module can directly activate the global protection process WF. When activating the global protection process WF, the processing module can control the switch control module 25 to turn off the switch module 24 to disconnect the battery pack 21 from the charging power source CS. When detecting that the temperature decreases to a protection deactivation threshold, the processing module can deactivate the global protection process WF. On the contrary, the conventional battery management system will directly activate the over-temperature charge protection function when detecting an abnormal temperature change, which cannot prevent from noise interference, so the over-temperature charge protection function tends to be frequently activated. The over-temperature charge protection function according to the present disclosure can effectively solve the above problem.

Figure 10:
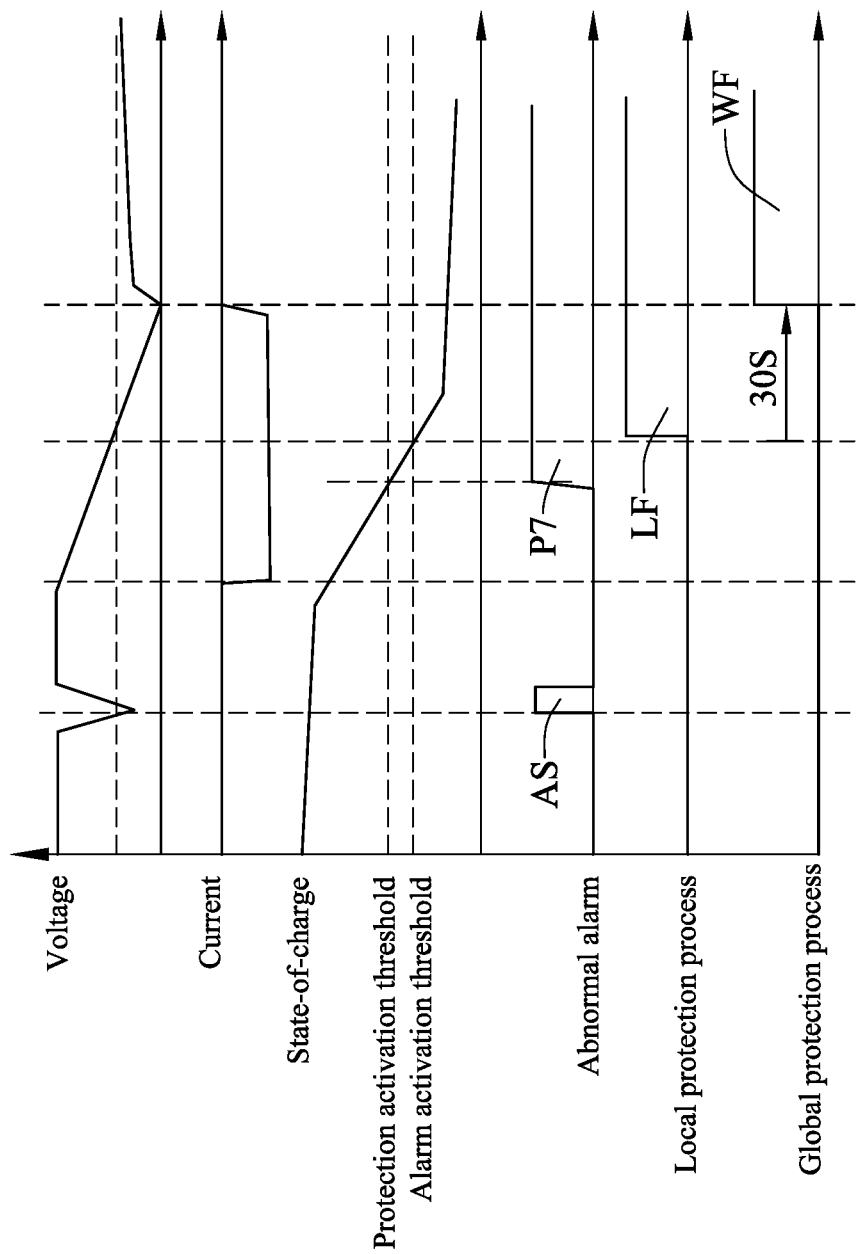
FIG. 10 is a seventh schematic view of the second embodiment in accordance with the present disclosure.

With reference to FIG. 10 for a seventh schematic view of the second embodiment in accordance with the present disclosure, FIG. 10 illustrates the process that the battery management system 2 activates the empty protection function.

As shown in FIG. 10, when detecting that the voltage suddenly decreases but the voltage and the current remain unchanged, the processing module can determine that an abnormal measurement occurs because the voltage signal is interfered by noise. Thus, the processing module can activate an abnormal measurement alarm signal AS when the voltage decreases to an alarm activation threshold, and deactivate the abnormal measurement alarm signal AS when the voltage increases to an alarm deactivation threshold.

When detecting that the state of charge decreases to the alarm activation threshold, and the voltage and the current simultaneously decrease, the processing module can determine that the battery pack 21 is in the discharge status; meanwhile, the processing module can activate an empty protection alarm signal P7. When detecting that the state of charge continues to decrease to the protection activation threshold, the processing module can determine the condition is of low danger and should activate the empty protection function to deal with the condition. Next, the processing module can activate the local protection process LF. When activating the local protection process LF, the processing module can deactivate the local protection process LF to activate the global protection process WF after the buffer time, such 30 seconds in order to control the switch control module 25 to turn off the switch module 24 to disconnect the battery pack 21 from the load L. On the contrary, the conventional battery management system will directly activate the empty protection function when detecting an abnormal voltage change, which cannot prevent from noise interference, so the empty protection function cannot really protect the battery pack 21. The empty protection function according to the present disclosure can effectively solve the above problem.

Figure 11:
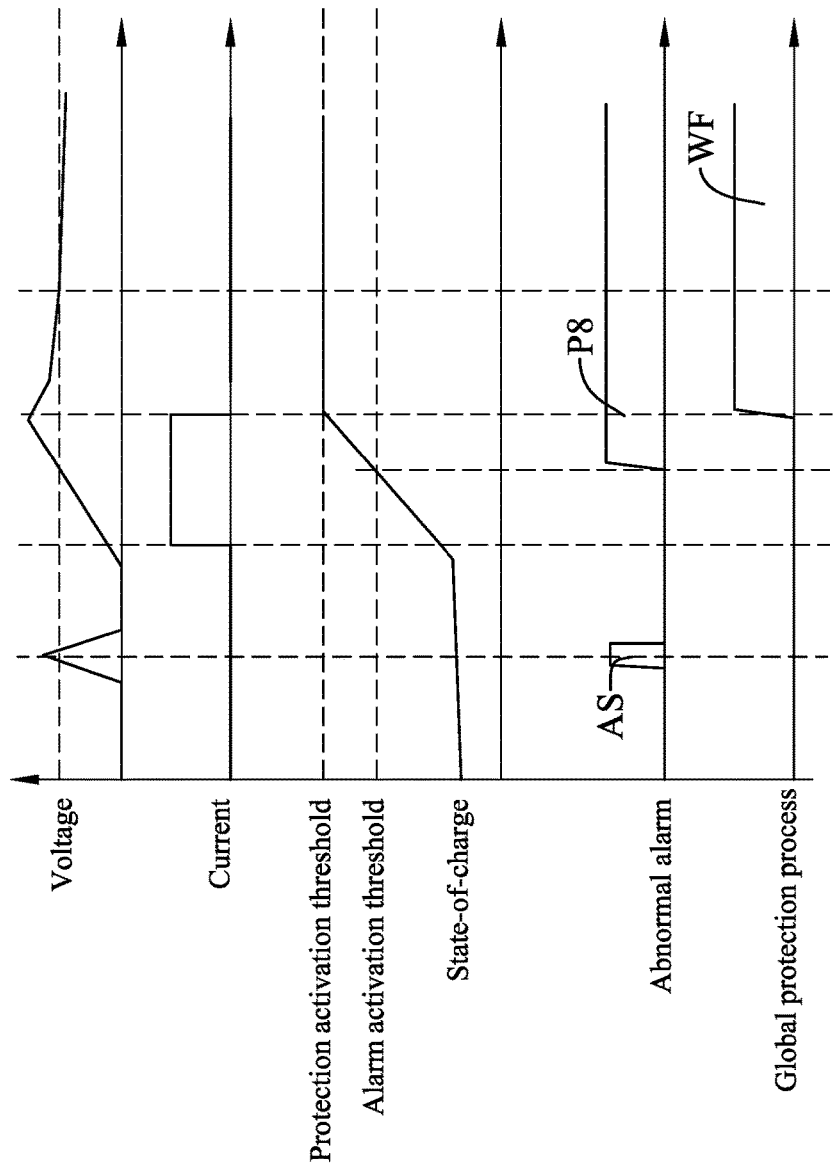
FIG. 11 is an eighth second schematic view of the second embodiment in accordance with the present disclosure.

With reference to FIG. 11 for an eighth schematic view of the second embodiment in accordance with the present disclosure, FIG. 11 illustrates the process that the battery management system 2 activates the fully charged protection.

As shown in FIG. 11, when detecting that the voltage suddenly increases but the current and the state of charge remain unchanged, the processing module can determine that an abnormal measurement occurs because the voltage signal is interfered by noise. Thus, the processing module can activate an abnormal measurement alarm signal AS when the voltage increases to a voltage alarm activation threshold, and deactivate the abnormal measurement alarm signal AS when the voltage decreases to the voltage alarm deactivation threshold.

When detecting that the state of charge suddenly increases to the alarm activation threshold, and the voltage and the current simultaneously increases, the processing module can determine that the battery pack 21 is in the charge status; meanwhile, the processing module can activate a fully charged protection alarm signal P8. When detecting that the state of charge continues to increase to the protection activation threshold, the processing module can determine the condition is of high danger and should activate the fully charged protection to deal with the condition. Next, the processing module can directly activate the global protection process WF. When activating the global protection process WF, the processing module can control the switch control module 25 to turn off the switch module 24 to disconnect the battery pack 21 from the charging power source CS. In other words, when detecting that the battery pack 21 is fully charged (SOC>95%), the processing module can disconnect the battery pack 21 from the charging power source SC in order to stop the battery pack 21 being charged, and processing module allows the battery pack 21 to be charged again until the state of charge of the battery pack 21 is lower than a threshold (SOC<=90%), which can significantly improve the safety and the service life of the battery pack 21. On the contrary, the conventional battery management system will directly activate the fully charged protection when detecting an abnormal voltage change, which cannot prevent from noise interference, so the fully charged protection tends to be frequently activated. The fully charged protection according to the present disclosure can effectively solve the above problem.

Figure 12:
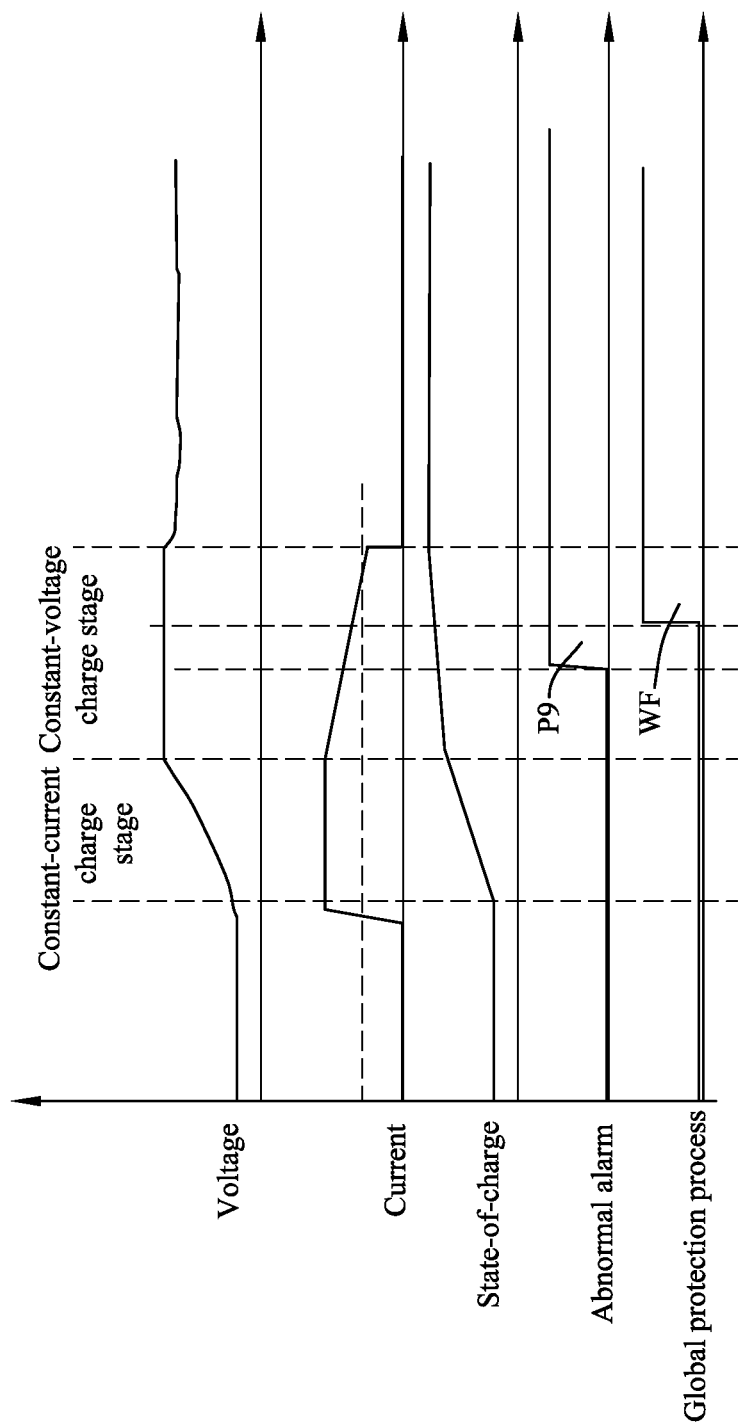
FIG. 12 is a ninth schematic view of the second embodiment in accordance with the present disclosure.

With reference to FIG. 12 for a ninth schematic view of the second embodiment in accordance with the present disclosure, FIG. 12 illustrates the process that the battery management system 2 activates the constant-voltage charge stage protection function.

As shown in FIG. 12, when detecting that the battery pack 21 leaves the constant-current charge stage and then enters the constant-voltage charge stage, and the duration of the constant-voltage charge stage exceeds the alarm activation threshold, the processing module can activate a constant-voltage charge time protection alarm signal P9. When detecting that the duration of the constant-voltage charge stage exceeds the protection activation threshold or the charging cutoff current is lower than a default threshold, whichever comes first, the processing module can determine the condition is of high danger and should activate the constant-voltage charge stage protection function to deal with the condition. Next, the processing module can directly activate the global protection process WF to disconnect the battery pack 21 from the charging power source CS. On the contrary, the conventional battery management system will activate the charge time protection function when detecting that the batteries have been charged for a default charge time, which may damage the batteries because the charge time of the batteries tend to be too long. The constant-voltage charge stage protection function according to the present disclosure can avoid that the battery pack 21 is damaged because the constant-voltage charge time is too long, which can extend the service life of the battery pack 21.

Figure 13A:
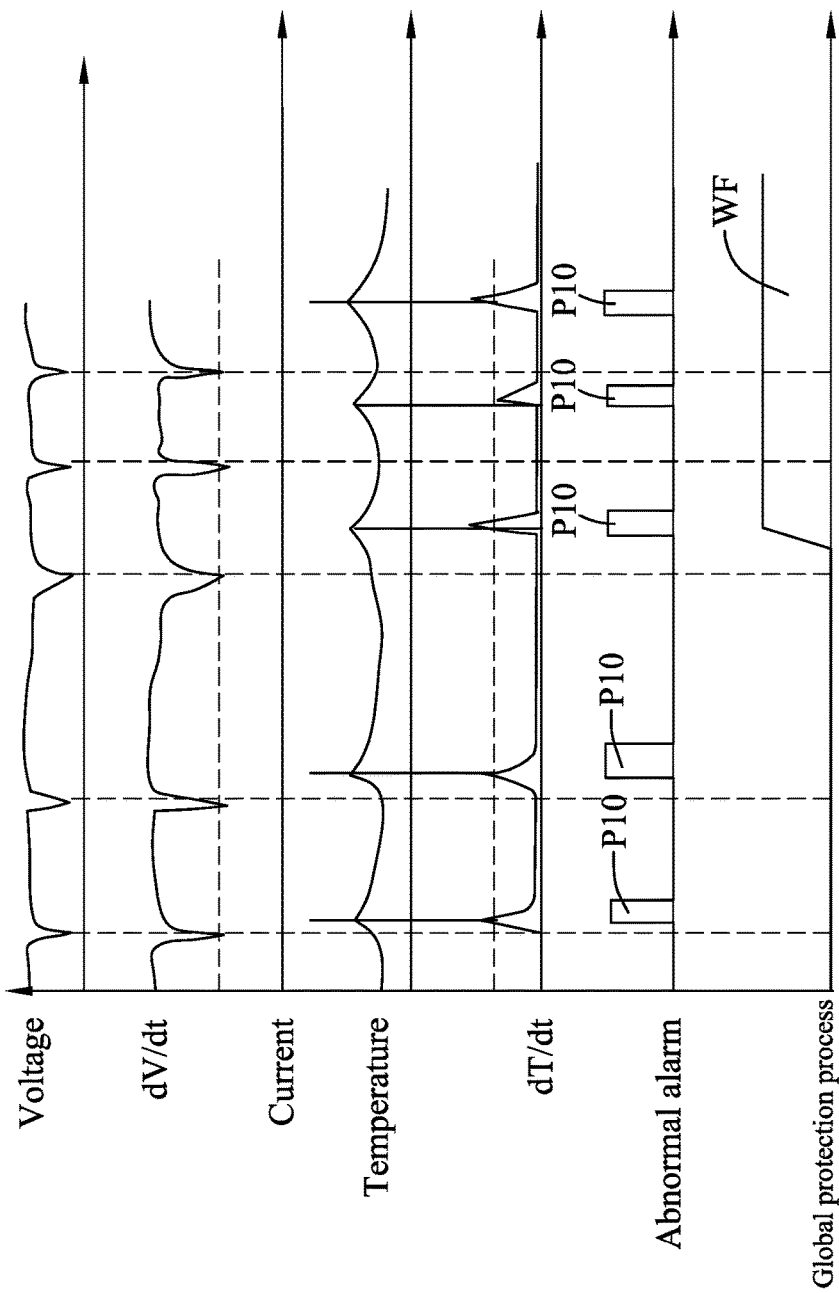
FIG. 13A is a tenth schematic view of the second embodiment in accordance with the present disclosure.

With reference to FIG. 13A for a tenth schematic view of the second embodiment in accordance with the present disclosure, FIG. 13A illustrates the process that the battery management system 2 activates the internal short-circuited protection function.

As shown in FIG. 13A, when detecting that the voltage and the temperature significantly change in a short time, and the voltage change and the temperature change respectively exceeds a voltage change threshold and a temperature change threshold, the process module can activate an internal short-circuited protection alarm signal P10. If the above condition keeps taking place for a default number of times (e.g. 3-5 times), the processing module can determine that the condition is of high danger and should activate the internal short-circuited protection function to deal with the condition. Next, the processing module can directly activate the global protection process WF. When activating the global protection process WF, the processing module can control the switch control module 25 to turn off the switch module 24 to disconnect the battery pack 21 from the charging power source CS. When the internal short-circuited condition occurs in the battery pack 21, the voltage of the battery pack 21 rapidly decreases in a short time, but the temperature of the battery pack 21 may not simultaneously increase because the energy generated by the short-circuited condition needs some time to increase the temperature of the battery pack 21. Generally speaking, the temperature of the battery pack 21 will obviously increase after the voltage of the battery pack 21 decreases (the temperature of the battery pack 21 may increase to the upper limit after 3-60 seconds). On the other hand, if the internal short-circuited condition fails to occur for several consecutive times, the temperature of the battery pack 21 will return to the normal temperature after several minutes. In addition, if the internal short-circuited condition occurs in the charge status of the battery pack 21 or does not occur in the constant-current discharge stage, the temperature of the battery pack 21 will increase.

Figure 13B:
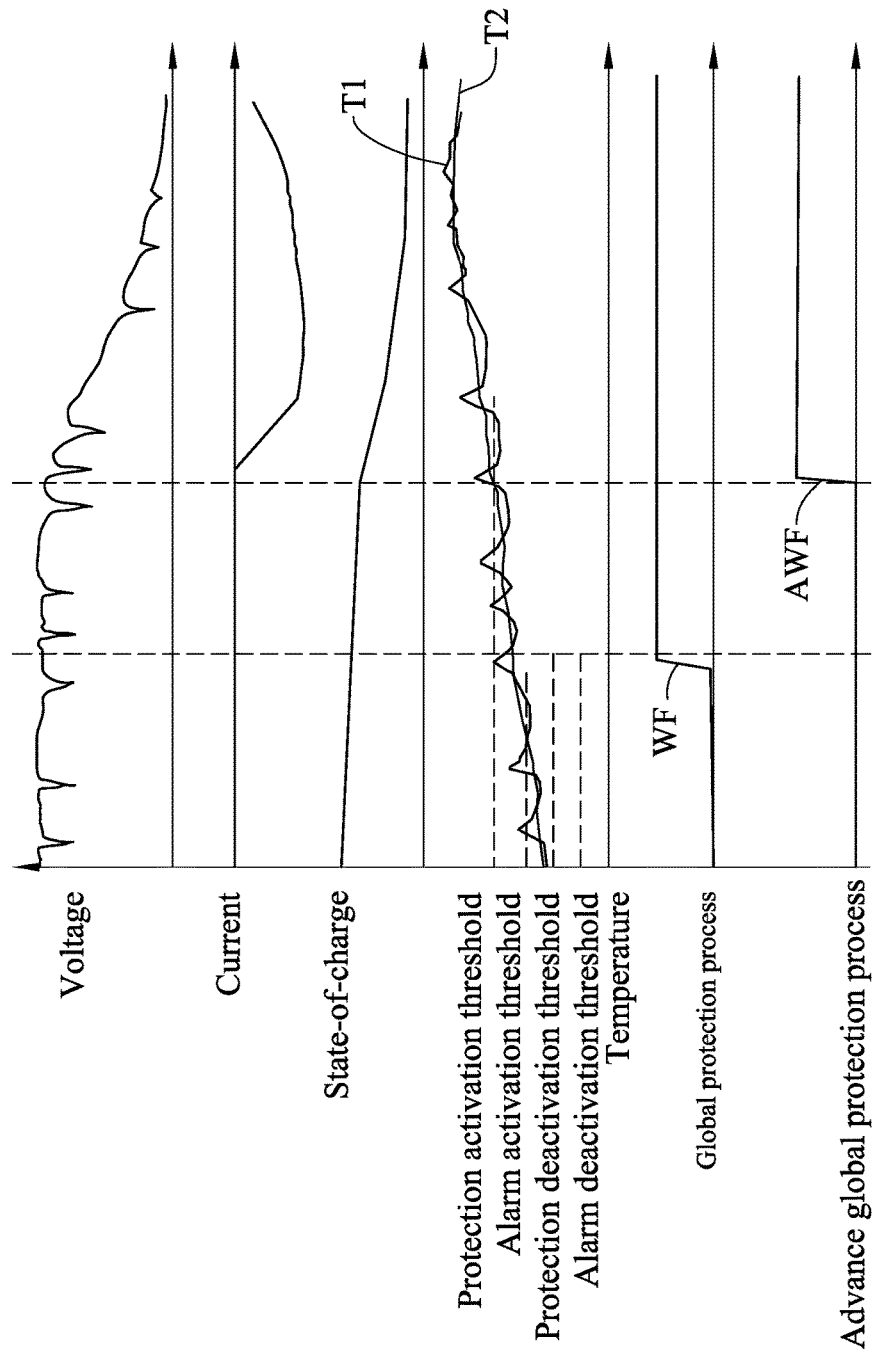
FIG. 13B is an eleventh schematic view of the second embodiment in accordance with the present disclosure.

With reference to FIG. 13B for an eleventh schematic view of the second embodiment in accordance with the present disclosure, FIG. 13B illustrates the process that the battery management system 2 activates the internal short-circuited temperature protection function.

If the processing module still detects that the average temperature of the battery pack 21 keeps increasing after activating the aforementioned internal short-circuited protection function, it means the state-of-charge of the battery pack 21 is still of high level and the short-circuited protection cannot effectively solve the problem. Therefore, the battery pack 21 is still in the internal short-circuited status. In this case, the battery pack 21 tends to explode due to thermal runaway.

As shown in FIG. 13B, the curve T1 stands for the temperature curve of the battery pack 21, and the curve T2 stands for the average temperature curve of the battery pack 21. If still detecting that the average temperature of the battery pack 21 continues to increase and exceeds the protection activation threshold, the processing module can determine that the condition is of high danger and should activate the internal short-circuited temperature protection function. Next, the processing module can directly activate an advanced global protection process AWF. When activating the advanced global protection process AWF, the processing module can wake up the load to control the load L so as to make all components of the load L work in full until the battery pack 21 runs down.

For example, when the battery management system 2 is applied to a smart phone or other 3C products, the processing module can activate the internal short-circuited temperature protection function to wake up the smart phone and make all components of the smart phone work in full (e.g. adjust the screen to the highest brightness, make the CPU operate in high speed and adjust the volume to maximum.) until the battery pack 21 runs down before thermal runaway, which can prevent the battery pack 21 from exploding.

On the contrary, the conventional battery management system activates the voltage or temperature protection only after detecting the abnormal voltage or temperature change reaches a threshold, which cannot detect the short-circuited condition at the beginning and cannot effectively perform the internal short-circuited protection function. Besides, when thermal runaway occurs in the batteries, the conventional battery management system cannot effectively prevent the batteries from exploding due to thermal runaway. The internal short-circuited temperature protection function according to the present disclosure can effectively solve the above problem.

With reference to FIG. 14A, FIG. 14B, FIG. 14C and FIG. 14D for twelfth, thirteenth, fourteenth and fifteenth schematic views of the second embodiment in accordance with the present disclosure, FIG. 14A, FIG. 14B, FIG. 14C and FIG. 14D illustrate the process that the battery management system 2 activates the switch failure protection function.

The switch module 24 may include a shunt SH, a current limit resistor CR and a plurality of sub-switches C-FET, D-FET and PreD-FET. If the battery pack 21 has yet to electrically couple to the load L or the charging power source CS, the processing module can control the switch control module 25 to determine whether any one of the sub-switches C-FET, D-FET and PreD-FET fails by switching the sub-switches C-FET, D-FET and PreD-FET. If detecting that any one of the sub-switches C-FET, D-FET and PreD-FET fails, the processing module can control the switch control module 25 to cut off the active/passive emergency protection unit 29.

Figure 14A:
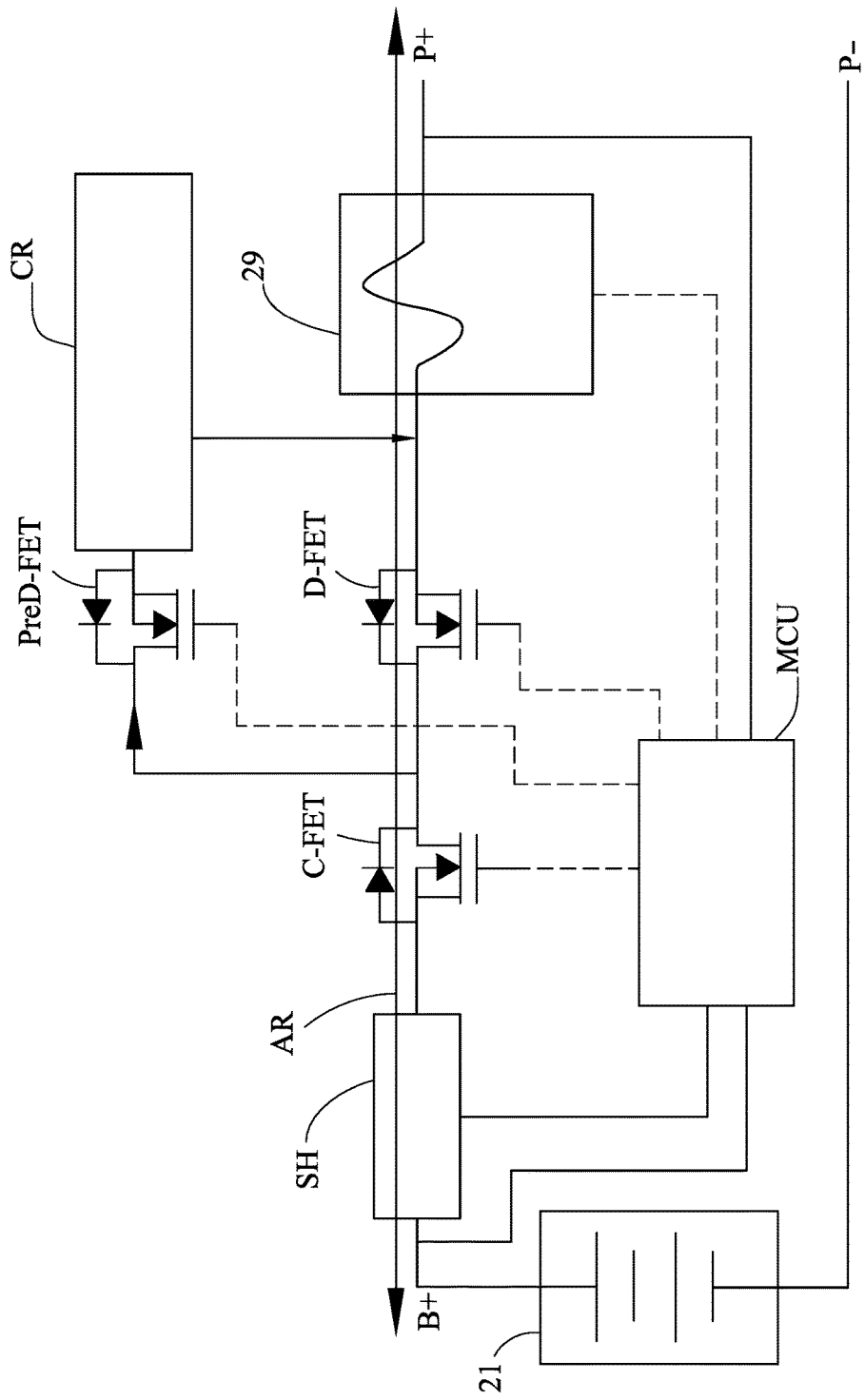
FIG. 14A is a twelfth schematic view of the second embodiment in accordance with the present disclosure.

As shown in FIG. 14A, when all of the sub-switches C-FET, D-FET and PreD-FET are turned on, the direction of the current is as shown by the arrow AR in FIG. 14A. For now, the voltage of the output $B^+$ of the battery pack 21 should be substantially equal to the voltage of the output $P^+$ of the battery management system 2 (i.e. $B^+ \approx P^+$).

Figure 14B:
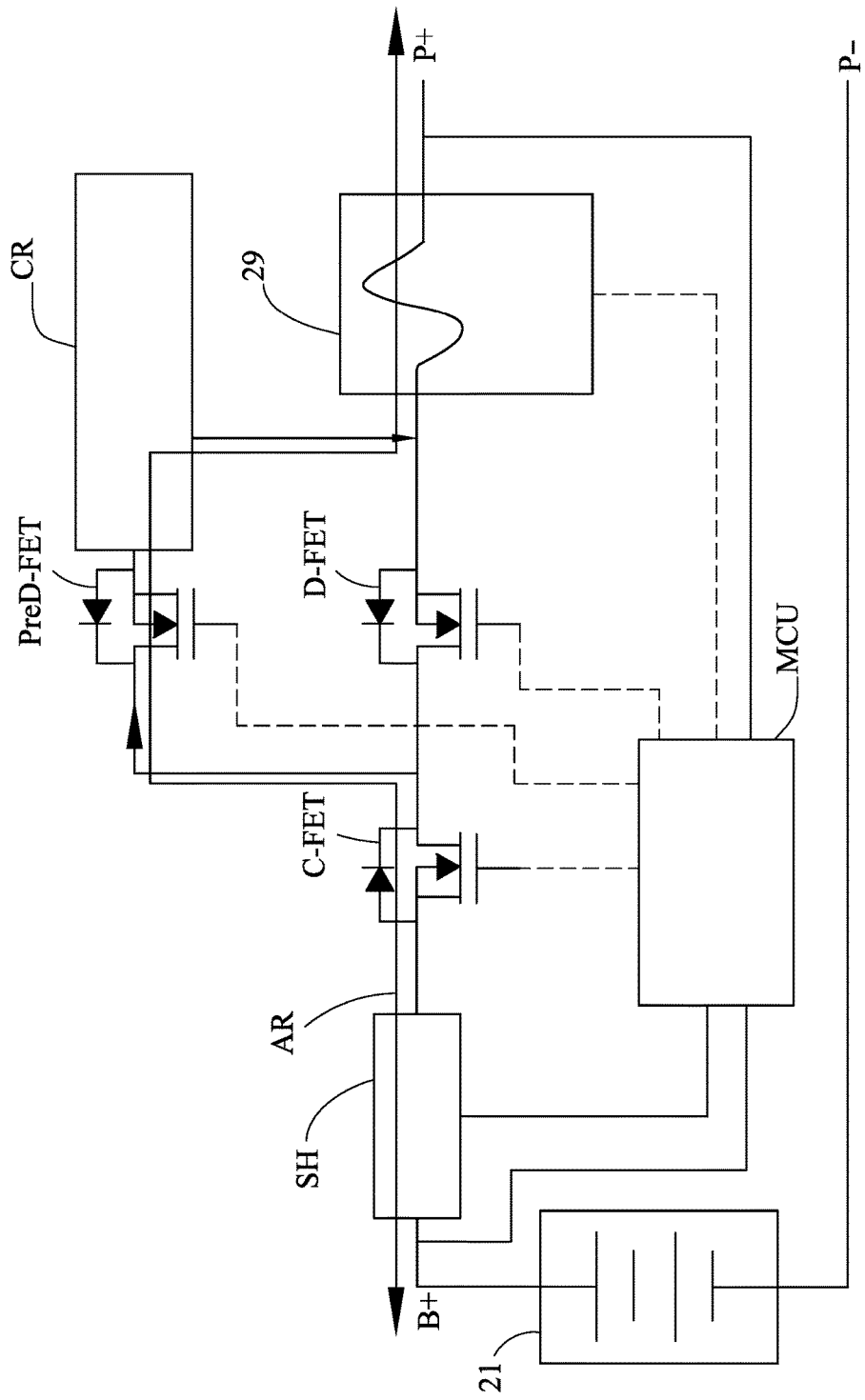
FIG. 14B is a thirteenth schematic view of the second embodiment in accordance with the present disclosure.

As shown in FIG. 14B, the switch control module 25 can turn off the sub-switch D-FET; then, the direction of the current is as shown by the arrow AR in FIG. 14B. For now, the voltage of the output $B^+$ of the battery pack 21 should be substantially equal to the sum of the voltage of the output $P^+$ of the battery management system 2 and the voltage difference $\Delta Vr$ across the current limit resistor CR (i.e. $B^+ \approx P^+ + \Delta Vr$). If the voltage of the output $B^+$ of the battery pack 21 is not equal to the sum of the voltage of the output $P^+$ of the battery management system 2 and the voltage difference $\Delta Vr$ across the current limit resistor CR, it means that the sub-switch D-FET fails and cannot be turned off. Afterward, the processing module can activate the switch failure protection function to control the switch control module 25 to cut off the active/passive emergency protection unit 29.

Figure 14C:
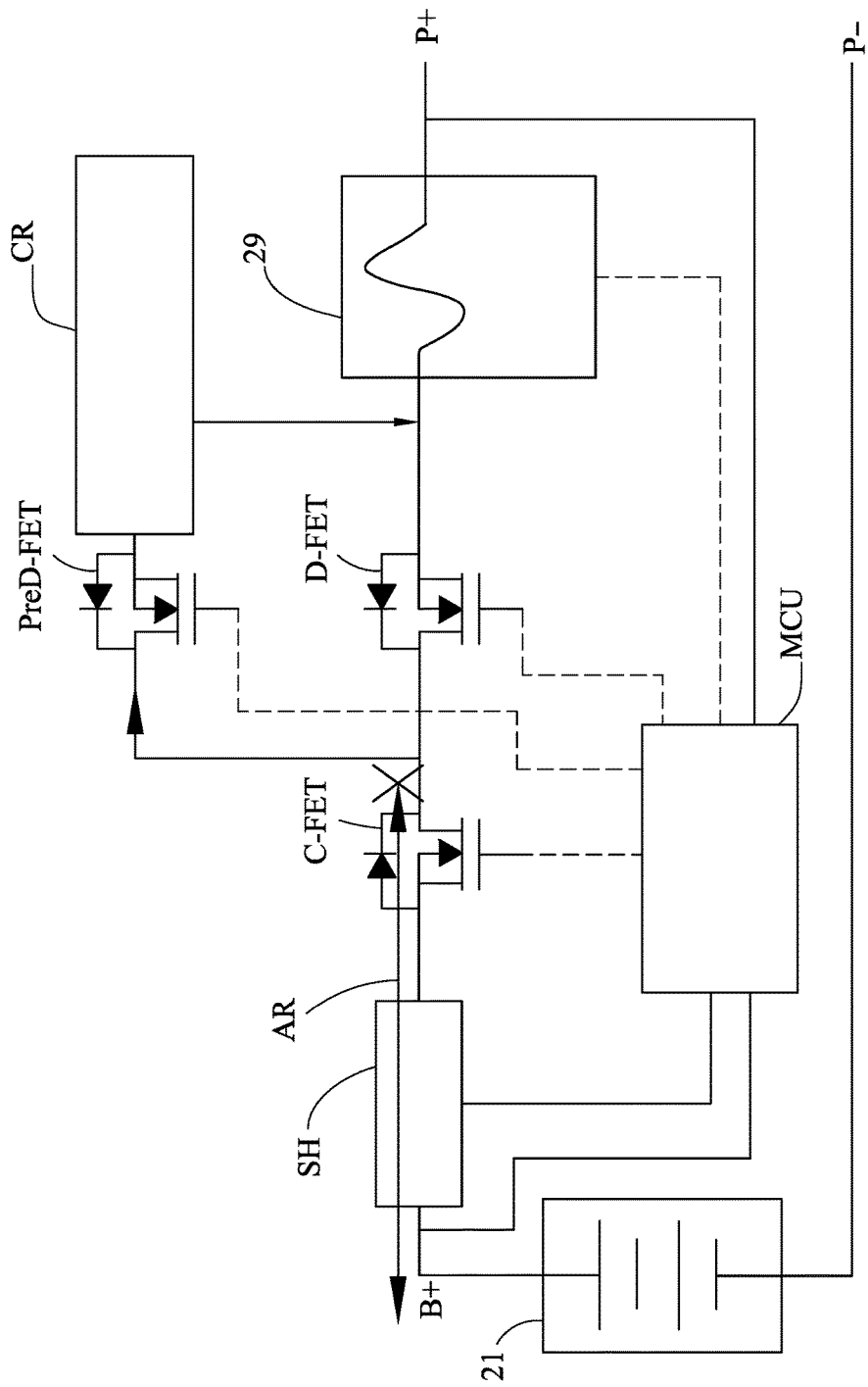
FIG. 14C is a fourteenth schematic view of the second embodiment in accordance with the present disclosure.

As shown in FIG. 14C, the switch control module 25 can further turn off the sub-switch PreD-FET; then, the direction of the current is as shown by the arrow AR in FIG. 14C. For now, the voltage of the output $P^+$ of the battery management system 2 should be zero (i.e. $P^+=0$). If the voltage of the output $P^+$ of the battery management system 2 is not zero, it means that the sub-switch PreD-FET fails and cannot be turned off. Afterward, the processing module can activate the switch failure protection function to control the switch control module 25 to cut off the active/passive emergency protection unit 29.

Figure 14D:
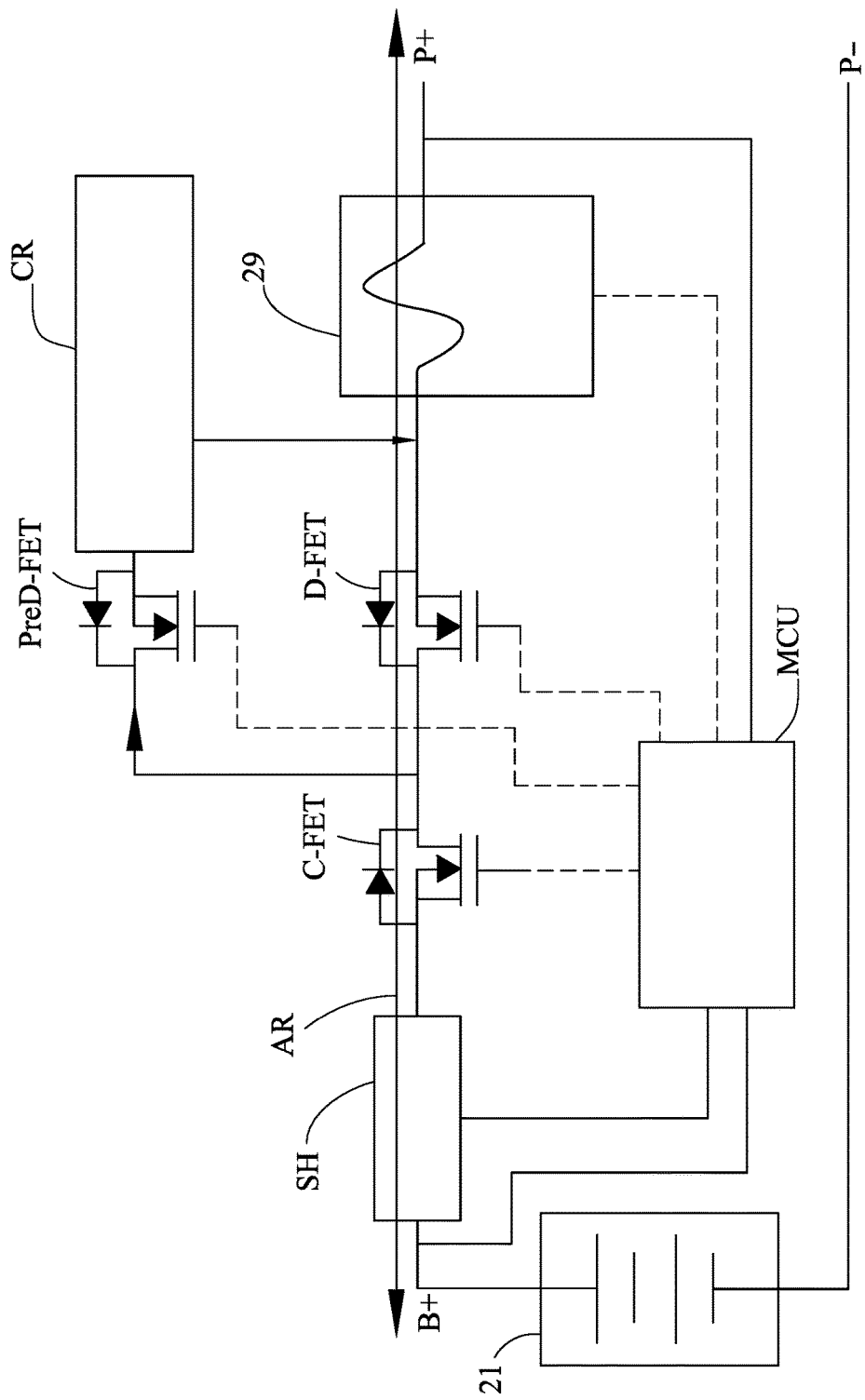
FIG. 14D is a fifteenth schematic view of the second embodiment in accordance with the present disclosure.

As shown in FIG. 14D, finally, the switch control module 25 can further turn on the sub-switch D-FET and turn off the sub-switch C-FET; then, the direction of the current is as shown by the arrow AR in FIG. 14D. For now, the voltage of the output $P^+$ of the battery management system 2 should be higher than the voltage of the output $B^+$ of the battery pack 21 (i.e. $B^+=P^++\Delta V$). If the voltage of the output $P^+$ of the battery management system 2 is almost equal to the voltage of the output $B^+$ of the battery pack 21, it means that the sub-switch C-FET fails and cannot be turned off. Afterward, the processing module can activate the switch failure protection function to control the switch control module 25 to cut off the active/passive emergency protection unit 29.

By means of the above switch failure protection function, the battery management system 2 can make sure that all switches of the battery management system 2 can correctly function, so the safety of the battery management system 2 can be further enhanced. On the contrary, the conventional battery management system fails to provide the switch failure protection function, so cannot make sure that all switches thereof can correctly function. Obviously, the switch failure protection function according to the present disclosure can effectively improve the shortcoming the conventional battery management system.

Figure 15:
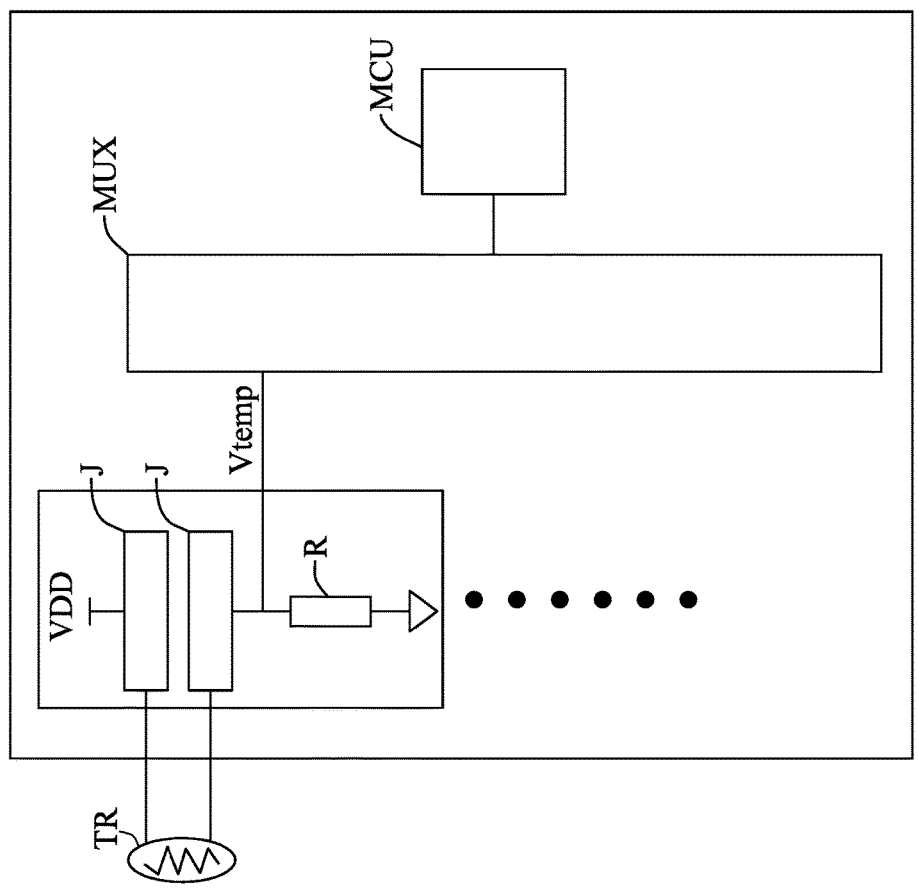
FIG. 15 is a sixteenth schematic view of the second embodiment in accordance with the present disclosure.

With reference to FIG. 15 for a sixteenth schematic view of the second embodiment in accordance with the present disclosure, FIG. 15 illustrates the process that the battery management system 2 activates the temperature measurement disconnection protection function.

The measurement module can activate the temperature measurement disconnection protection function to measure the voltage division of the thermistor TR of each of the battery units 21 so as to determine whether the temperature of each of the battery units 21 can be correctly measured. The cell voltage and temperature measurement unit 22C of the measurement module may include a temperature measurement circuit for measuring the voltage division of the thermistor TR coupled to each of the battery units 21, where the voltage division of each thermistor TR can be expressed as: $Vtemp=VDD*(R/(TR+R))$. The voltage division signal of each thermistor TR can be transmitted to the microcontroller unit MCU via the multiplexer Mux. However, if the connection line of any one of the joints J is disconnected from the thermistor TR, the voltage division Vtemp of the thermistor is zero. Currently, the processing module can control the switch control module 25 to turn off the switch module 24. Accordingly, the above temperature measurement disconnection protection function can make sure that the temperature of the battery pack 21 can be precisely measured, which can effectively increase the precision of the battery management system 2. On the contrary, the conventional battery management system fail to provide the temperature measurement disconnection protection function, so cannot make sure that the temperature of the batteries can be precisely measured. Obviously, the temperature measurement disconnection protection function according to the present disclosure can actually improve the shortcoming the conventional battery management system.

Figures 16A, 16B:
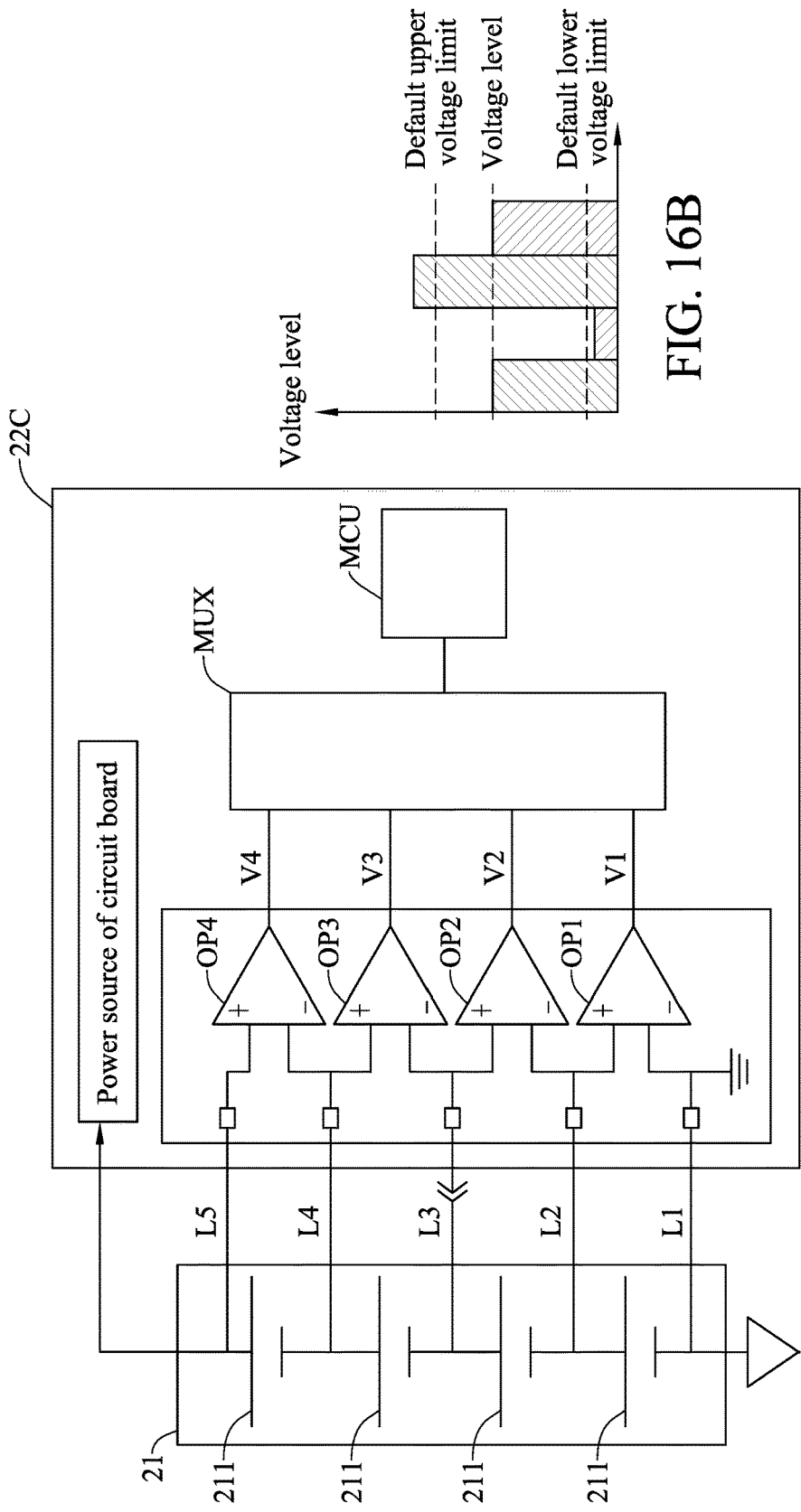
FIG. 16A is a seventeenth schematic view of the second embodiment in accordance with the present disclosure.
FIG. 16B is an eighteenth schematic view of the second embodiment in accordance with the present disclosure.

With reference to FIG. 16A and FIG. 16B for seventeenth and eighteenth schematic views of the second embodiment in accordance with the present disclosure, FIG. 16A and FIG. 16B illustrate the process that the battery management system 2 activates the voltage measurement disconnection protection function.

As shown in FIG. 16A, the measurement module can activate the voltage measurement disconnection protection function to measure the voltage difference between any two adjacent battery units 211 so as to determine whether the voltage of each of the battery units 211 can be precisely measured. The cell voltage and temperature measurement unit 22C of the measurement module may include a voltage measurement circuit, which may include a plurality operational amplifiers OP1~OP4. These operational amplifiers OP1~OP4 are electrically coupled to the battery units 211 respectively via the measurement lines L1~L5, and at least one end of any one of the battery units 211 is electrically coupled to the inverting input node of one operational amplifier and the non-inverting input node of another operational amplifier. The voltage signal of the battery pack 21 can be transmitted to the microcontroller unit MCU via the operational amplifiers OP1~OP4 and the multiplexer Mux.

If any one of the measurement lines L1~L5 is disconnected, the voltage of the battery unit 211 above the disconnected measurement line will be extremely high and exceed a default voltage upper limit, and the voltage of the battery unit 211 below the disconnected measurement line will be extremely low and exceed a default voltage lower limit. As shown in FIG. 16B, if the measurement line L3 is disconnected, the measured voltage V3 of the third battery unit 211 will be extremely high and exceed the default voltage upper limit, and the measured voltage V2 of the second battery unit 211 will be extremely low and exceed the default voltage lower limit. Therefore, the processing module can determine whether any one of the measurement lines is disconnected by checking whether the measured voltage of any one of the battery units 211 is higher than the default voltage upper limit or lower than the default voltage lower limit.

If the measurement line L5 is disconnected, the measured voltage V4 of the fourth battery unit 211 will be close to zero; if the measurement line L1 is disconnected, the battery pack 21 will no longer supply power to the battery management system 2. Thus, the above voltage measurement disconnection protection function can make sure that the voltage of the battery pack 21 can be precisely measured, which can effectively better the precision of the battery management system 2. On the contrary, the conventional battery management system fails to provide the voltage measurement disconnection protection function, so cannot make sure that the voltage of the batteries can be precisely measured. As describe above, the temperature measurement disconnection protection function according to the present disclosure can actually improve the shortcoming the conventional battery management system.

With reference to FIG. 17A and FIG. 17B for nineteenth and twentieth schematic views of the second embodiment in accordance with the present disclosure, FIG. 17A and FIG. 17B illustrate the process that the battery management system 2 activates the voltage measurement disconnection protection function.

As shown in FIG. 17A, the measurement module can activate the voltage measurement disconnection protection function to measure the voltage difference between any two adjacent battery units 211 so as to determine whether the voltage of each of the battery units 211 can be precisely measured. The cell voltage and temperature measurement unit 22C of the measurement module may include a voltage measurement circuit, which may include a plurality operational amplifiers OP1~OP4. These operational amplifiers OP1~OP4 are electrically coupled to the battery units 211 respectively via the measurement lines L1~L8, and each of the operational amplifiers OP1~OP4 electrically coupled to one battery unit 211. The voltage signal of the battery pack 21 can be transmitted to the microcontroller unit MCU via the operational amplifiers OP1~OP4 and the multiplexer Mux. Compared with the voltage measurement circuit shown in FIG. 16A, the voltage measurement circuit shown in FIG. 17A can achieve higher precision.

If the disconnected measurement line is originally coupled to the non-inverting input node of one operational amplifier, the output of the operational amplifier will be zero and exceed a default voltage lower limit; if the disconnected measurement line is originally coupled to the inverting input node of one operational amplifier, the output of the operational amplifier will be extremely high and exceed a default voltage upper limit. As shown in FIG. 17B, if the measurement line L4 is disconnected, the measured voltage V2 of the second battery unit 211 will be extremely low and exceed the default voltage lower limit; if the measurement line L7 is disconnected, the measured voltage V4 of the fourth battery unit 211 will be extremely high and exceed the default voltage upper limit. Therefore, the processing module can determine whether any one of the measurement lines is disconnected by checking whether the measured voltage of any one of the battery units 211 is higher than the default voltage upper limit or lower than the default voltage lower limit.

Thus, the above voltage measurement disconnection protection function can make sure that the voltage of the battery pack 21 can be precisely measured, which can effectively better the precision of the battery management system 2. On the contrary, the conventional battery management system fails to provide the voltage measurement disconnection protection function, so cannot make sure that the voltage of the batteries can be precisely measured. As describe above, the temperature measurement disconnection protection function according to the present disclosure can actually improve the shortcoming the conventional battery management system.

As described above, the battery management system 2 can compare the operation signals of the battery pack 21 by cross comparison to determine the operation status of the battery pack 21, and then activate the corresponding safety protection item according to the operation status and at least one of the operation signals, so the battery management system 2 will not be interfered by noise, which can significantly increase the performance of the battery management system 2. In addition, the battery management system 2 can activate the local protection process for the safety protection items without immediate danger, which can provide a buffer time to effectively avoid that the electric vehicle suddenly loses all electricity when the user is driving the electric vehicle; accordingly, the safety of the battery management system 2 can be enhanced. Moreover, the battery management system 2 can provide a protection activation threshold and a protection deactivation threshold for some safety protection items, which can avoid that these safety protection items are frequently activated and deactivated in order to further improve the reliability of the battery management system 2. Furthermore, the battery management system 2 can provide the voltage measurement disconnection protection function, current measurement disconnection protection function and temperature measurement disconnection protection function so as to make sure that the voltage, current and temperature of the batteries can be precisely measured and the battery management system 2 can function normally, which can better the measurement precision and the safety of the battery management system.

It is worthy to point out that although the conventional battery management system can provide multiple safety protection items, the conventional battery management system considers only one signal when executing one safety protection item; thus, the false operation rate of the conventional battery management system tends to be increased because being interfered by noise. On the contrary, according to one embodiment of the present disclosure, the battery management system can compare the operation signals of the power supply module by cross comparison, such as two or more of current signal, voltage signal, temperature signal and state-of-charge signal; afterward, the battery management system can determine the operation status (e.g. charge status, discharge status and at-rest status) of the power supply module, and then activate the corresponding safety protection item according to the operation status and at least one of the operation signals, so the battery management system will not be interfered by noise. Accordingly, the false operation rate thereof can be reduced, which can significantly increase the performance of the battery management system.

Besides, when activating the charge time protection function, the conventional battery management system directly activates the protection function after the batteries are charged for a default charge time; however, the batteries may be almost fully charged when the batteries start to be charged, so the above protection function tends to damage the batteries because the duration of the constant-voltage charge stage is too long, which will significantly decrease the service life of the batteries.

In addition, according to one embodiment of the present disclosure, the safety protection items of the battery management system can provide various alarm signal setting parameters and setting parameters of all safety protection items for different climates, so the battery management system can be applied to different zones with different climates; thus, the battery management system can be more comprehensive in use.

Moreover, according to one embodiment of the present disclosure, the battery management system can provide the voltage measurement disconnection protection function, current measurement disconnection protection function and temperature measurement disconnection protection function so as to make sure that the voltage, current and temperature of the batteries can be precisely measured, which can better the measurement precision of the battery management system.

Furthermore, according to one embodiment of the present disclosure, the battery management can precisely determine whether the switches fail, and provide the corresponding protection function after the switches fails, which can make sure that all switches of the battery management system can work normally. Therefore, the safety of the battery management system can be further enhanced.

Figure 18:
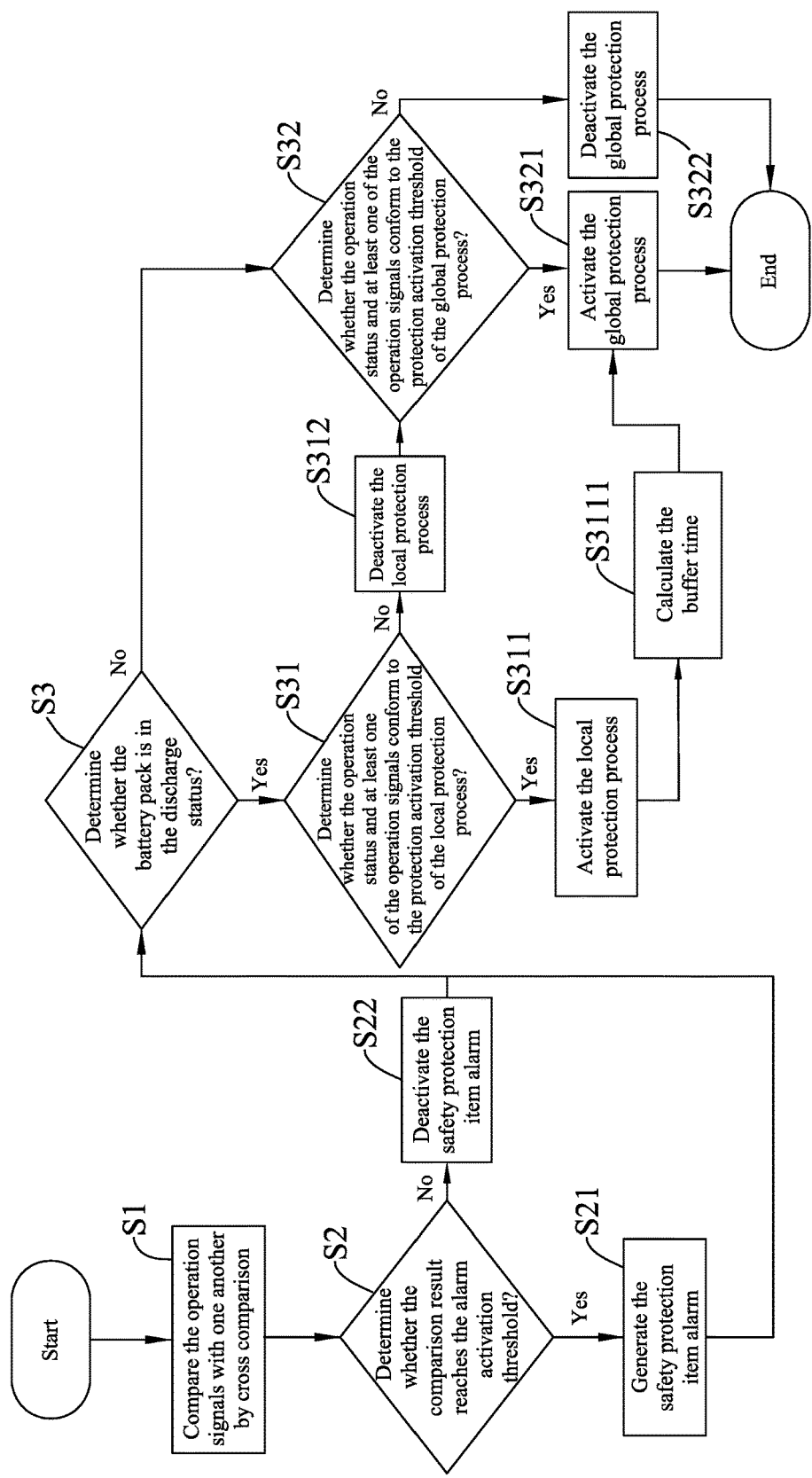
FIG. 18 is a flow chart of the second embodiment in accordance with the present disclosure.

With reference to FIG. 18 for a flow chart of the second embodiment in accordance with the present disclosure, the battery management method of the embodiment may include the following steps:

In Step S1: Compare the operation signals with one another by cross comparison; then, the flow proceeds to Step S2.

In Step S2: Determine whether the comparison result reaches the alarm activation threshold? If it does, the flow proceeds to Step S21; if it does not, the flow proceeds to Step S22.

In Step S21: Generate the safety protection item alarm; then, the flow proceeds to Step S3.

In Step S22: Deactivate the safety protection item alarm; then, the flow proceeds to Step S3.

In Step S3: Determine whether the battery pack is in the discharge status? If it does, the flow proceeds to Step S31; if it does not, the flow proceeds to Step S32.

In Step S31: Determine whether the operation status and at least one of the operation signals conform to the protection activation threshold of the local protection process? If it does, the flow proceeds to Step S311; if it does not, the flow proceeds to Step S312.

In Step S311: Activate the local protection process; then, the flow proceeds to Step S3111.

In Step S3111: Calculate the buffer time; then, the flow proceeds to Step S321.

In Step S312: Deactivate the local protection process; then, the flow proceeds to Step S32.

In Step S32: Determine whether the operation status and at least one of the operation signals conform to the protection activation threshold of the global protection process? If it does, the flow proceeds to Step S321; if it does not, the flow proceeds to Step S322.

In Step S321: Activate the global protection process.

In Step S322: Deactivate the global protection process.

In summation of the description above, the integrated power module according to the exemplary embodiments of the present disclosure may have the following advantages:

(1) According to one embodiment of the present disclosure, the battery management system can determine the operation status of the power supply module by cross comparison between the operation signals of the power supply module, and activate a safety protection item according to the operations signals and the operation status, so the battery management system will not be interfered by noise. Accordingly, the false operation rate thereof can be reduced, which can significantly increase the performance of the battery management system.

(2) According to one embodiment of the present disclosure, the battery management system can activate the local protection process for the safety protection items without immediate danger, which can provide a buffer time for the user to park the electric vehicle at a proper place. Thus, the electric vehicle will not suddenly lose all electricity when the user is driving the electric vehicle; accordingly, the safety of the battery management system can be enhanced.

(3) According to one embodiment of the present disclosure, the battery management system can provide a protection activation threshold and a protection deactivation threshold for some safety protection items, which can avoid that these safety protection items are frequently activated and deactivated in order to further improve the reliability of the battery management system.

(4) According to one embodiment of the present disclosure, the battery management system can provide the constant-voltage charge stage protection function during the charge process, which can avoid that the batteries are damaged because the duration of the constant-voltage charge stage is too long or the charging cutoff current is too low. Therefore, the service life of the batteries can be increased.

(5) According to one embodiment of the present disclosure, the safety protection items of the battery management system can provide various alarm signal setting parameters and setting parameters of all safety protection items for different climates, so the battery management system can be applied to different zones with different climates; thus, the battery management system can be more comprehensive in use.

(6) According to one embodiment of the present disclosure, the battery management system can provide the voltage measurement disconnection protection function, current measurement disconnection protection function and temperature measurement disconnection protection function so as to make sure that the voltage, current and temperature of the batteries can be precisely measured, which can better the measurement precision of the battery management system.

(7) According to one embodiment of the present disclosure, the battery management can precisely determine whether the switches fail, and provide the corresponding protection function after the switches fails, which can make sure that all switches of the battery management system can work normally. Therefore, the safety of the battery management system can be further enhanced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A battery management system, comprising:
    a switch module;
    a power supply module, electrically coupled to a load or a charging power source via the switch module;
    a measurement module, configured to measure a plurality of operation signals from the power supply module; and
    a processing module, configured to determine an operation status of the power supply module by cross comparison between the operation signals, and activate a safety protection item according to the operations signals and the operation status, wherein the processing module determines to activate a global protection process to turn off the switch module or activate a local protection process to turn off the switch module after a buffer time.

2. The battery management system of claim 1, wherein the operation signals comprise two or more of a current signal, a voltage signal, a temperature signal and a state-of-charge signal.

3. The battery management system of claim 1, wherein the operation status is a discharge status, charge status or an at-rest status.

4. The battery management system of claim 1, wherein the processing module determines whether to activate the local protection process or the global protection process according to a danger level of the safety protection item.

5. The battery management system of claim 1, wherein the processing module generates an abnormal measurement alarm signal according to at least one of the operation signals and an alarm threshold.

6. The battery management system of claim 1, wherein the processing module activates the safe protection item according to the operation status, at least one of the operation signals and a protection activation threshold, and then deactivates the safe protection item according to the operation status, at least one of the operation signals and a protection deactivation threshold.

7. The battery management system of claim 1, wherein the power supply module comprises a plurality of battery units, and the measurement module activates a temperature measurement disconnection protection function to measure a voltage division of a thermistor of each of the battery units in order to determine whether a temperature of each of the battery units is correctly measured.

8. The battery management system of claim 1, wherein the power supply module comprises a plurality of battery units, and the measurement module activates a voltage measurement disconnection protection function to measure a voltage difference between any two adjacent battery units in order to determine whether a voltage of each of the battery units is correctly measured.

9. The battery management system of claim 1, further comprises an emergency protection module, wherein the switch module is electrically coupled to the load or the charging power source via the emergency protection module, and electrically coupled to the processing module; the switch module comprises a plurality of sub-switches.

10. The battery management system of claim 3, further comprises an emergency protection module, wherein the switch module is electrically coupled to the load or the charging power source via the emergency protection module; when a current flowing through the emergency protection module exceeds a threshold, the emergency protection module is automatically cut off.

11. The battery management system of claim 3, wherein the safety protection item is an over-voltage charge protection function, an under-voltage discharge protection function, an over-current charge protection function, an over-current discharge protection function, an over-temperature discharge protection function, an over-temperature charge protection function, an empty protection function, a fully-charged protection function, a constant-voltage charge stage protection function or an internal short-circuited protection function.

12. The battery management system of claim 3, wherein when the processing module determines that the power supply module is in the charge status and a voltage of the power supply module exceeds a protection activation threshold, the processing module activates a fully-charged protection function to activate the global protection process, and then cancels the fully-charged protection function when the voltage of the power supply module is lower than or equal to a lower limit.

13. The battery management system of claim 3, wherein when the processing module determines that the power supply module is in the charge status and reaches a constant-voltage charge stage, the processing module activates a constant-voltage charge stage protection function to activate the global protection process after a duration of the constant-voltage charge stage exceeds a protection activation threshold or a charging cutoff current is lower than a default threshold.

14. The battery management system of claim 5, wherein the processing module activates the local protection process after the abnormal measurement alarm signal lasts a default time period.

15. The battery management system of claim 5, wherein the processing module activates a switch failure protection function to determine whether any one of the sub-switches fails by switching the sub-switches; if any one of the sub-switches fails, the processing module cuts off the emergency protection module.

16. The battery management system of claim 11, wherein when the processing module determines that an average temperature of the power supply module exceeds a protection activation threshold after the internal short-circuited protection function is activated, the processing module activates an internal short-circuited temperature protection function, and then activates an advanced global protection process to wake up the load and make the load work in full.

17. A battery management method, comprising the following steps:
   electrically coupling a power supply module to a load or a charging power source via a switch module;
   measuring a plurality of operation signals from the power supply module by a measurement module; and
   determining an operation status of the power supply module by cross comparison between the operation signals, and activating a safety protection item according to the operations signals and the operation status by a processing module so as to determine to activate a global protection process to turn off the switch module or activate a local protection process to turn off the switch module after a buffer time.

18. The battery management method of claim 17, wherein the operation signals comprise two or more of a current signal, a voltage signal, a temperature signal and a state-of-charge signal.

19. The battery management method of claim 17, wherein the operation status is a discharge status, charge status or an at-rest status.

20. The battery management method of claim 17, further comprising the following step:
   determining whether to activate the local protection process or the global protection process according to a danger level of the safety protection item by the processing module.

21. The battery management method of claim 17, further comprising the following step:
   generating an abnormal measurement alarm signal according to at least one of the operation signals and an alarm threshold by the processing module.

22. The battery management method of claim 17, further comprising the following steps:
   activating the safe protection item according to the operation status, at least one of the operation signals and a protection activation threshold by the processing module; and
   deactivating the safe protection item according to the operation status, at least one of the operation signals and a protection deactivation threshold by the processing module.

23. The battery management method of claim 17, further comprising the following step:
   executing a temperature measurement disconnection protection function to measure a voltage division of a thermistor of each of the battery units by the measurement module in order to determine whether a temperature of each of battery units of the power supply module is correctly measured.

24. The battery management method of claim 17, further comprising the following step:
   executing a voltage measurement disconnection protection function to measure a voltage difference between any two adjacent battery units of the power supply module by the measurement module in order to determine whether a voltage of each of the battery units of the power supply module is correctly measured.

25. The battery management method of claim 17, wherein the switch module is electrically coupled to the load or the charging power source via an emergency protection module, and electrically coupled to the processing module; the switch module comprises a plurality of sub-switches.

26. The battery management method of claim 17, further comprising the following step:
   electrically coupling the switch module to the load or the charging power source via the emergency protection module, and cutting off the emergency protection module when a current flowing through the emergency protection module exceeds a threshold.

27. The battery management method of claim 18, wherein the safety protection item is an over-voltage charge protection function, an under-voltage discharge protection function, an over-current charge protection function, an over current discharge protection function, an over-temperature discharge protection function, an over-temperature charge protection function, an empty protection function, a fully-charged protection function, a constant-voltage charge stage protection function or an internal short-circuited protection function.

28. The battery management method of claim 18, further comprising the following step:
   executing a fully-charged protection function to activate the global protection process by the processing module when the processing module determines that the power supply module is in the charge status and a voltage of the power supply module exceeds a protection activation threshold; and
   cancelling the fully-charged protection function by the processing module when the voltage of the power supply module is lower than or equal to a lower limit.

29. The battery management method of claim 18, further comprising the following step:
   executing a constant-voltage charge stage protection function by the processing module when the processing module determines that the power supply module is in the charge status and reaches a constant-voltage charge stage so as to activate the global protection process after a duration of the constant-voltage charge stage exceeds a protection activation threshold or a charging cutoff current is lower than a default threshold.

30. The battery management method of claim 20, further comprising the following step:
   activating the local protection process by the processing module after the abnormal measurement alarm signal lasts a default time period.

31. The battery management method of claim 24, further comprising the following step:
   executing a switch failure protection function by the processing module to determine whether any one of the sub-switches fails by switching the sub-switches; and
   cutting off the emergency protection module by the processing module if any one of the sub-switches fails.

32. The battery management method of claim 27, further comprising the following step:

Determining whether an average temperature of the power supply module exceeds a protection activation threshold by the processing module after the internal short-circuited protection function is activated; and executing an internal short-circuited temperature protection function, and then activating an advanced global protection process to wake up the load and make the load work in full by the processing module by the processing module when the processing module determines that the average temperature of the power supply module exceeds the protection activation threshold.

* * * * *